US011271278B2

(12) United States Patent
Suzuki et al.

(10) Patent No.: US 11,271,278 B2
(45) Date of Patent: Mar. 8, 2022

(54) TRANSMISSION LINE AND ANTENNA MODULE

(71) Applicant: Murata Manufacturing Co., Ltd., Kyoto (JP)

(72) Inventors: Sho Suzuki, Kyoto (JP); Keisei Takayama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 141 days.

(21) Appl. No.: 16/874,743

(22) Filed: May 15, 2020

(65) Prior Publication Data

US 2020/0274221 A1  Aug. 27, 2020

Related U.S. Application Data

(63) Continuation of application No. PCT/JP2018/042391, filed on Nov. 16, 2018.

(30) Foreign Application Priority Data

Nov. 16, 2017  (JP) .............................. JP2017-221195

(51) Int. Cl.
*H01P 5/08* (2006.01)
*H01P 3/00* (2006.01)
(Continued)

(52) U.S. Cl.
CPC ................ *H01P 5/08* (2013.01); *H01P 3/003* (2013.01); *H01P 3/06* (2013.01); *H01P 3/08* (2013.01);
(Continued)

(58) Field of Classification Search
CPC ............. H01Q 1/22–48; H01Q 21/065; H01Q 21/0075; H01Q 23/00; H01P 3/003; H01P 3/08; H01P 5/08
See application file for complete search history.

(56) References Cited

U.S. PATENT DOCUMENTS 6,400,234 B1   6/2002  Ohhashi et al.
9,196,951 B2 *  11/2015  Baks .................... H01Q 1/2283
(Continued)

FOREIGN PATENT DOCUMENTS

JP   2001-044716 A   2/2001
JP   2004-006608 A   1/2004
(Continued)

OTHER PUBLICATIONS

International Search Report issued in Patent Application No. PCT/JP2018/042391 dated Jan. 29, 2019.
(Continued)

*Primary Examiner* — Hasan Islam
(74) *Attorney, Agent, or Firm* — Pearne & Gordon LLP

(57) ABSTRACT

A transmission line (12) includes a multilayer substrate (20), a signal pattern line (30), a ground pattern conductor (50), and an intermediate ground pattern conductor (40) that is arranged between the signal pattern line (30) and the ground pattern conductor (50) and that is electrically connected to the ground pattern conductor (50). The signal pattern line (30) has a first connection point (30c) to which a signal conductor extending in a laminating direction of the multilayer substrate (20) is connected. A first cavity portion (41h) is formed in the intermediate ground pattern conductor (40) at a position overlapped with a first end portion (30a) of the signal pattern line (30) in a plan view of the multilayer substrate (20). A first end edge (41e) of the first cavity portion (41h) has a first overlapping portion (41a) overlapped with the signal pattern line (30).

20 Claims, 28 Drawing Sheets

(51) Int. Cl.
*H01P 3/06* (2006.01)
*H01P 3/08* (2006.01)
*H01Q 1/48* (2006.01)
*H01Q 21/00* (2006.01)
*H01Q 21/06* (2006.01)
*H01Q 23/00* (2006.01)

(52) U.S. Cl.
CPC ........... *H01Q 1/48* (2013.01); *H01Q 21/0075* (2013.01); *H01Q 21/065* (2013.01); *H01Q 23/00* (2013.01)

(56) References Cited

U.S. PATENT DOCUMENTS

| | | | |
|---|---|---|---|
| 10,763,566 B2 * | 9/2020 | Noori | H01Q 5/378 |
| 2005/0098348 A1 | 5/2005 | Okumichi et al. | |

FOREIGN PATENT DOCUMENTS

| | | |
|---|---|---|
| JP | 2005-079762 A | 3/2005 |
| JP | 2013-074256 A | 4/2013 |
| JP | 2015-050679 A | 3/2015 |
| JP | 2015-050680 A | 3/2015 |

OTHER PUBLICATIONS

Written Opinion issued in Patent Application No. PCT/JP2018/042391 dated Jan. 29, 2019.

* cited by examiner

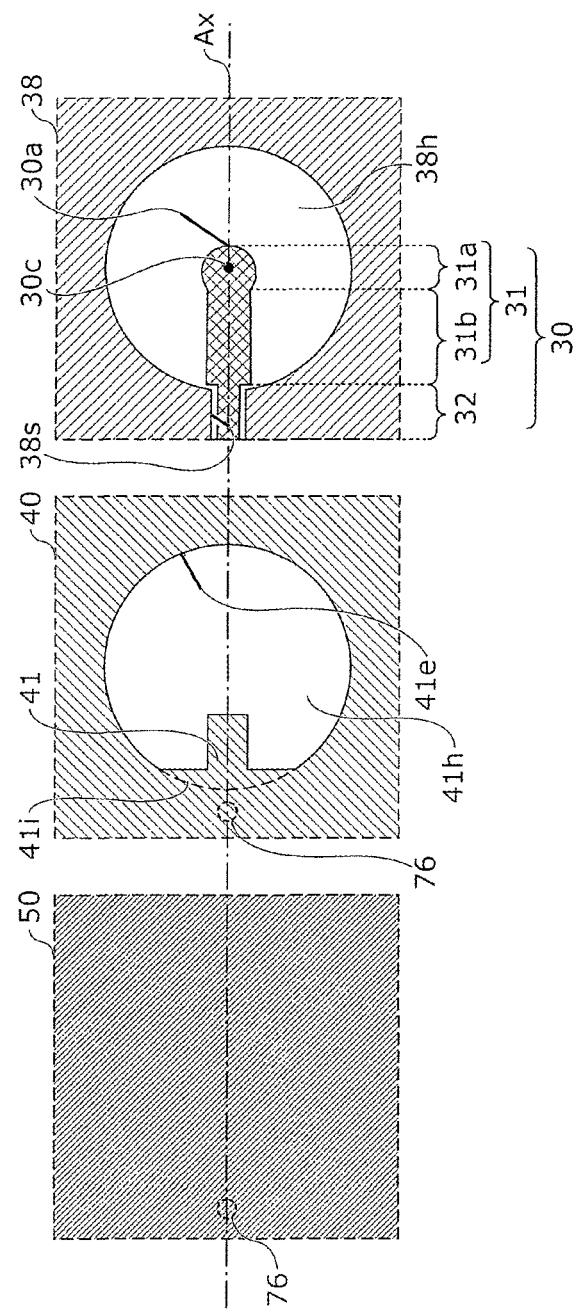

freq (10.00 MHz to 20.00 GHz)

freq (10.00 MHz to 20.00 GHz)

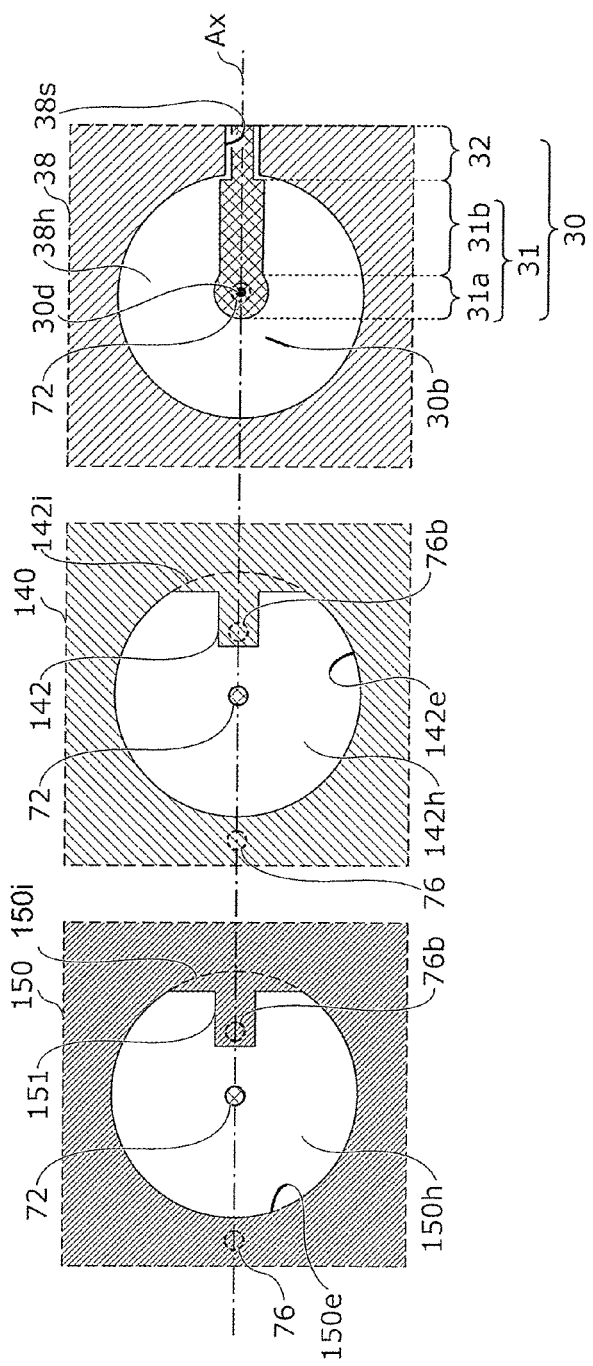

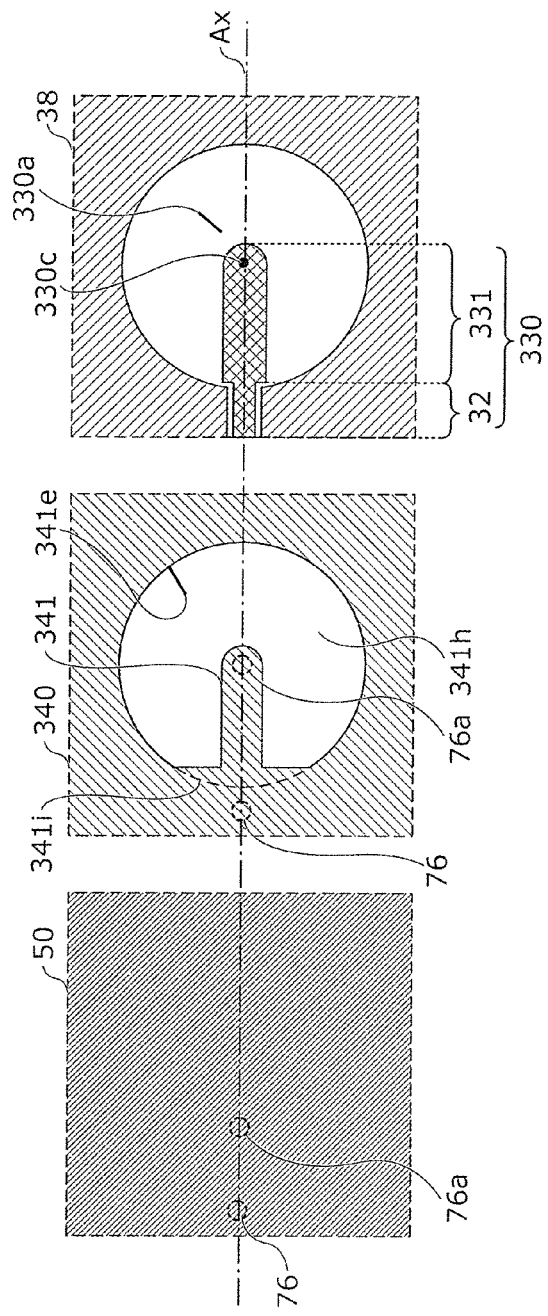

TRANSMISSION LINE AND ANTENNA MODULE

This is a continuation of International Application No. PCT/JP2018/042391 filed on Nov. 16, 2018 which claims priority from Japanese Patent Application No. 2017-221195 filed on Nov. 16, 2017. The contents of these applications are incorporated herein by reference in their entireties.

BACKGROUND OF THE DISCLOSURE

Field of the Disclosure

The present disclosure relates to a transmission line through which a radio-frequency signal is transmitted and an antenna module including the transmission line.

Description of the Related Art

Transmission lines using multilayer substrates have hitherto been used as transmission lines through which radio-frequency signals are transmitted. An integrated circuit is mounted on the multilayer substrate, and terminals of the integrated circuit are connected to the transmission lines. Radio-frequency transmission lines including a strip line and a coplanar line are formed on surface layers or inner layers of the multilayer substrate.

There is a case in which a signal outputted from a terminal of the integrated circuit mounted on one main surface of such a multilayer substrate is transmitted to the other main surface thereof. In such a case, it is necessary to form, for example, a signal via hole line for transmitting the signal in a laminating direction of the multilayer substrate. A ground pattern conductor is formed in the multilayer substrate and the signal via hole line passes through the ground pattern conductor. A circular cavity portion is formed around the signal via hole line in a portion where the signal via hole line passes through in the ground pattern conductor to form a pseudo coaxial line. The distribution of an electromagnetic field in a portion where the signal via hole line is connected to the strip line or the like is different from the distribution of the electromagnetic field in an ideal coaxial line or strip line. Accordingly, impedance mismatching occurs in the connection portion.

In order to reduce such impedance mismatching, a method of adjusting the shape of the cavity formed in the ground pattern conductor is proposed (Patent Document 1). In a transmission line described in Patent Document 1, the impedance mismatching in the connection portion is intended to be reduced by adjusting the shape of the cavity portion.

Patent Document 1: Japanese Unexamined Patent Application Publication No. 2013-74256

BRIEF SUMMARY OF THE DISCLOSURE

Although the impedance mismatching in the connection portion between the signal via hole line extending in the laminating direction of the multilayer substrate and the strip line or the like extending in a lamination in-plane direction of the multilayer substrate is capable of being reduced with the method described in Patent Document 1, the impedance mismatching may occur also in portions other than the connection portion in the transmission line formed on the multilayer substrate.

In order to resolve the above problem, it is an object of the present disclosure to reduce the impedance mismatching in the transmission line using the multilayer substrate.

In order to achieve the above object, a transmission line according to one aspect of the present disclosure includes a multilayer substrate formed of a dielectric body; a signal pattern line arranged on the multilayer substrate; a ground pattern conductor that is arranged at a position different from that of the signal pattern line in a laminating direction of the multilayer substrate and that is overlapped with the signal pattern line in a plan view of the multilayer substrate; and an intermediate ground pattern conductor that is arranged between the signal pattern line and the ground pattern conductor in the laminating direction of the multilayer substrate and that is electrically connected to the ground pattern conductor. The signal pattern line has a first connection point to which a signal conductor is connected. The signal conductor extends from the signal pattern line in a direction away from the intermediate ground pattern conductor in the laminating direction of the multilayer substrate. The first connection point is arranged in a first end portion, which is one end portion of the signal pattern line. A first cavity portion opening at a position overlapped with the first end portion of the signal pattern line in a plan view of the multilayer substrate is formed in the intermediate ground pattern conductor. In a plan view of the multilayer substrate, a first end edge, which is an end edge of the first cavity portion, has a first overlapping portion overlapped with the signal pattern line. The distance between the first overlapping portion and the first connection point is shorter than the distance between any portion other than the first overlapping portion of the first end edge and the first connection point.

As described above, the signal conductor extending in the laminating direction of the multilayer substrate is connected at the first connection point in the first end portion of the signal pattern line of the transmission line according to one aspect of the present disclosure. Impedance mismatching occurs in a portion where the transmission direction of signals in the transmission line is varied. In order to match the impedance in the signal conductor extending in the laminating direction of the multilayer substrate, means for providing a circular cavity in the intermediate ground pattern conductor to form the pseudo coaxial line is considered. No conductor passing through the cavity exists, unlike the cavity portion disclosed in Patent Document 1. The cavity supposed in this case has a circular end edge around the first connection point in a plan view of the multilayer substrate. The shape of the circular end edge is hereinafter referred to as a virtual circle. Since the intermediate ground pattern conductor opposed to the vicinity of the first end portion of the signal pattern line does not exist although the impedance mismatching in the signal conductor is reduced with such a cavity, the impedance mismatching occurs near the first end portion of the signal pattern line. In the transmission line according to one aspect of the present disclosure, the first end edge of the first cavity portion of the intermediate ground pattern conductor has the first overlapping portion overlapped with the signal pattern line in a plan view of the multilayer substrate. The distance between the first overlapping portion and the first connection point is shorter than the distance between any portion other than the first overlapping portion of the first end edge and the first connection point. Accordingly, the portion that is not overlapped with the intermediate ground pattern conductor, in the portion near the first end portion of the signal pattern line, in a plan view of the multilayer substrate is capable of being reduced, compared with a case in which a cavity having an end edge along the virtual circle around the first connection point is formed in the intermediate ground pattern conductor in a plan view of the multilayer substrate. Continuously forming the intermediate ground pattern conductor from the outside to the inside of the virtual circle in the intermediate ground pattern conductor at the position opposed to the signal pattern line in the above manner enables the impedance mismatching in the portion near the first end portion of the signal pattern line to be reduced. In the present description, the representation of "the impedance of the signal pattern line" means the impedance of a line composed of the signal pattern line and the conductors including the intermediate ground pattern conductor arranged around the signal pattern line. The same applies to the representation of "the impedance of the signal via hole line" and so on.

In the transmission line according to one aspect of the present disclosure, the intermediate ground pattern conductor may have a first projecting portion that projects toward the inside of the first cavity portion along the signal pattern line in a plan view of the multilayer substrate.

With the above configuration, it is possible to adjust the impedance of the signal pattern line in the area where the first projecting portion is overlapped with the signal pattern line in a plan view of the multilayer substrate. Adjusting the impedance of the signal pattern line in the above manner enables the impedance mismatching near the first end portion of the signal pattern line to be reduced.

The transmission line according to one aspect of the present disclosure may further include a first ground via hole conductor which is arranged in a portion of the intermediate ground pattern conductor, overlapped with the signal pattern line, in a plan view of the multilayer substrate and with which the intermediate ground pattern conductor is connected to the ground pattern conductor.

With the above configuration, parasitic capacitance occurring between the portion in the intermediate ground pattern conductor, which affects the impedance of the signal pattern line, and the ground pattern conductor is capable of being reduced. Accordingly, it is possible to reduce the impedance mismatching caused by the parasitic capacitance of the signal pattern line.

The transmission line according to one aspect of the present disclosure may further include a first ground via hole conductor which is arranged in a portion of the intermediate ground pattern conductor, overlapped with the signal pattern line, in a plan view of the multilayer substrate and with which the intermediate ground pattern conductor is connected to the ground pattern conductor. The first ground via hole conductor may be arranged in the first projecting portion.

Although the parasitic capacitance is likely to occur between the intermediate ground pattern conductor and the ground pattern conductor because the first projecting portion is an end portion projecting from the intermediate ground pattern conductor, connecting the first projecting portion to the ground pattern conductor with the first ground via hole conductor enables the parasitic capacitance in the first projecting portion to be reduced. Accordingly, it is possible to reduce the impedance mismatching caused by the parasitic capacitance of the signal pattern line.

In the transmission line according to one aspect of the present disclosure, the signal pattern line may include a wide width portion including the first end portion and a narrow width portion that is connected to the wide width portion and that is narrower than the wide width portion. The first projecting portion may be overlapped with the narrow width portion and may not be overlapped with the wide width portion in a plan view of the multilayer substrate.

Adjusting the shape of the first projecting portion and the relative position between the first projecting portion and the signal pattern line in accordance with the shape of the signal pattern line in the above manner enables the impedance of the signal pattern line to be adjusted to a desired value.

The transmission line according to one aspect of the present disclosure may further include a signal via hole line that is connected to the signal pattern line and that extends in the laminating direction of the multilayer substrate to pass through the intermediate ground pattern conductor at a position different from that of the first cavity portion.

In the transmission line according to one aspect of the present disclosure, a second cavity portion through which the signal via hole line passes may be formed in the intermediate ground pattern conductor. In a plan view of the multilayer substrate, a second end edge, which is an end edge of the second cavity portion, may have a second overlapping portion overlapped with the signal pattern line. The distance between the second overlapping portion and a second connection point of the signal pattern line, to which the signal via hole line is connected, may be shorter than the distance between any portion other than second overlapping portion of the second end edge and the second connection point.

As described above, the signal via hole line extending in the laminating direction of the multilayer substrate is connected at the second connection point arranged in the second end portion of the signal pattern line of the transmission line according to one aspect of the present disclosure. The impedance mismatching occurs in a portion where the transmission direction of signals in the transmission line is varied. In order to match the impedance in the signal via hole line passing through the intermediate ground pattern conductor, means for providing a circular cavity in the intermediate ground pattern conductor to form the pseudo coaxial line is considered. The cavity supposed in this case has a circular end edge around the second connection point in a plan view of the multilayer substrate. The shape of the circular end edge is hereinafter referred to as the virtual circle, as in the circular end edge referred to in the description of the first cavity portion. Since the intermediate ground pattern conductor opposed to the vicinity of the second end portion of the signal pattern line does not exist although the impedance mismatching in the signal via hole line is reduced with such a cavity, the impedance mismatching occurs near the second end portion of the signal pattern line. In the transmission line according to one aspect of the present disclosure, the second end edge of the second cavity portion of the intermediate ground pattern conductor has the second overlapping portion overlapped with the signal pattern line in a plan view of the multilayer substrate. The distance between the second overlapping portion and the second connection point is shorter than the distance between any portion other than the second overlapping portion of the second end edge and the second connection point. Accordingly, the portion that is not overlapped with the intermediate ground pattern conductor, in the portion near the second end portion of the signal pattern line, is capable of being reduced, compared with a case in which a cavity having an end edge along the virtual circle around the second connection point is formed in the intermediate ground pattern conductor in a plan view of the multilayer substrate. Continuously forming the intermediate ground pattern conductor from the outside to the inside of the virtual circle in the intermediate ground pattern conductor at the position opposed to the signal pattern line in the above manner enables the impedance mismatching in the portion near the second end portion of the signal pattern line to be reduced.

In the transmission line according to one aspect of the present disclosure, the intermediate ground pattern conductor may have a second projecting portion that projects toward the inside of the second cavity portion along the signal pattern line.

With the above configuration, it is possible to adjust the impedance of the signal pattern line in the area where the second projecting portion is overlapped with the signal pattern line in a plan view of the multilayer substrate. Adjusting the impedance of the signal pattern line in the above manner enables the impedance mismatching near the second end portion of the signal pattern line to be reduced.

The transmission line according to one aspect of the present disclosure may further have a second ground via hole conductor which is arranged at a position of the intermediate ground pattern conductor, overlapped with the signal pattern line, in a plan view of the multilayer substrate and with which the intermediate ground pattern conductor is connected to the ground pattern conductor.

With the above configuration, the parasitic capacitance occurring between the portion in the intermediate ground pattern conductor, which affects the impedance of the signal pattern line, and the ground pattern conductor is capable of being reduced. Accordingly, it is possible to reduce the impedance mismatching caused by the parasitic capacitance of the signal pattern line.

The transmission line according to one aspect of the present disclosure may further include a second ground via hole conductor which is arranged at a position of the intermediate ground pattern conductor, overlapped with the signal pattern line, in a plan view of the multilayer substrate and with which the intermediate ground pattern conductor is connected to the ground pattern conductor. The second ground via hole conductor may be arranged in the second projecting portion.

Although the parasitic capacitance is likely to occur between the intermediate ground pattern conductor and the ground pattern conductor 50 because the second projecting portion is an end portion projecting from the intermediate ground pattern conductor, connecting the second projecting portion to the ground pattern conductor with the second ground via hole conductor enables the parasitic capacitance in the second projecting portion to be reduced. Accordingly, it is possible to reduce the impedance mismatching caused by the parasitic capacitance of the signal pattern line.

The transmission line according to one aspect of the present disclosure may further include a signal-layer ground pattern conductor that is arranged at the same position as that of the signal pattern line in the laminating direction of the multilayer substrate. The signal pattern line may include a strip line portion including the first end portion and a coplanar line portion arranged in a slit portion formed in the signal-layer ground pattern conductor.

The transmission line according to one aspect of the present disclosure may include multiple signal pattern lines and multiple signal via hole lines connected to the respective multiple signal pattern lines.

An antenna module according to one aspect of the present disclosure includes the transmission line and multiple patch antennas that are connected to the respective multiple signal via hole lines of the transmission line and that are arranged in an array pattern.

With the above configuration, since the impedance mismatching in the signal pattern line connected to the patch antenna is capable of being reduced, it is possible to reduce loss in signal transmission. Accordingly, it is possible to improve radiation efficiency in the antenna module.

The antenna module according to one aspect of the present disclosure may further include an integrated circuit including multiple terminals connected to the respective multiple signal pattern lines of the transmission line.

With the above configuration, since the impedance mismatching in the signal pattern line between the patch antenna and the integrated circuit is capable of being reduced, it is possible to reduce the loss in the signal transmission. Accordingly, it is possible to improve the radiation efficiency in the antenna module.

In the antenna module according to one aspect of the present disclosure, the multilayer substrate may have a first main surface and a second main surface positioned at a rear side of the first main surface, the integrated circuit may be arranged on the first main surface, and the multiple patch antennas may be arranged at the second main surface side with respect to the first main surface.

With the above configuration, since the distance between the multiple patch antenna and the integrated circuit is capable of being decreased, compared with a case in which the multiple patch antennas and the integrated circuit are arranged on the same main surface of the substrate, the loss of signals in the transmission line is capable of being reduced. In addition, the antenna module is capable of being reduced in size.

An antenna module according to one aspect of the present disclosure includes a transmission line and at least one of a patch antenna and an integrated circuit connected to the transmission line. The transmission line includes a multilayer substrate formed of a dielectric body, a signal pattern line arranged in the multilayer substrate, a ground pattern conductor that is arranged at a position different from that of the signal pattern line in a laminating direction of the multilayer substrate and that is overlapped with the signal pattern line in a plan view of the multilayer substrate, an intermediate ground pattern conductor that is arranged between the signal pattern line and the ground pattern conductor in the laminating direction of the multilayer substrate and that is electrically connected to the ground pattern conductor, and a signal via hole line that is connected to one end portion of the signal pattern line and that extends from the signal pattern line in a direction away from the intermediate ground pattern conductor in the laminating direction of the multilayer substrate. A cavity portion opening at a position overlapped with the one end portion in a plan view of the multilayer substrate is formed in the intermediate ground pattern conductor. The signal via hole line is connected to the patch antenna or the integrated circuit via no line extending in the laminating direction.

Forming the cavity portion in the intermediate ground pattern conductor in the above manner enables the impedance mismatching near the connection point between the signal via hole line connected to the patch antenna or the integrated circuit via no other via hole line and the signal pattern line to be reduced.

According to the present disclosure, it is possible to reduce the impedance mismatching in the transmission line using the multilayer substrate.

BRIEF DESCRIPTION OF THE SEVERAL VIEWS OF THE DRAWINGS

FIG. 4 is a plan view illustrating the shapes of a ground pattern conductor, an intermediate ground pattern conductor, and the signal pattern line near the first end portion of the signal pattern line of the transmission line according to the first embodiment.

FIG. 15 is a plan view illustrating the shapes of a ground pattern conductor, an intermediate ground pattern conductor, and the signal pattern line near the second end portion of the signal pattern line of the transmission line according to the second embodiment.

FIG. 18 is a plan view illustrating the shapes of the ground pattern conductor, an intermediate ground pattern conductor, and a signal pattern line near a first end portion, which is one end portion of the transmission line according to a thirteenth modification.

Each of FIGS. 24A, 24B, 24C and 24D is a plan view illustrating the shapes of a junction pattern line, a ground pattern conductor, the intermediate ground pattern conductor, and the signal pattern line near the second end portion of the signal pattern line of the transmission line according to the seventeenth modification.

Figure 25:
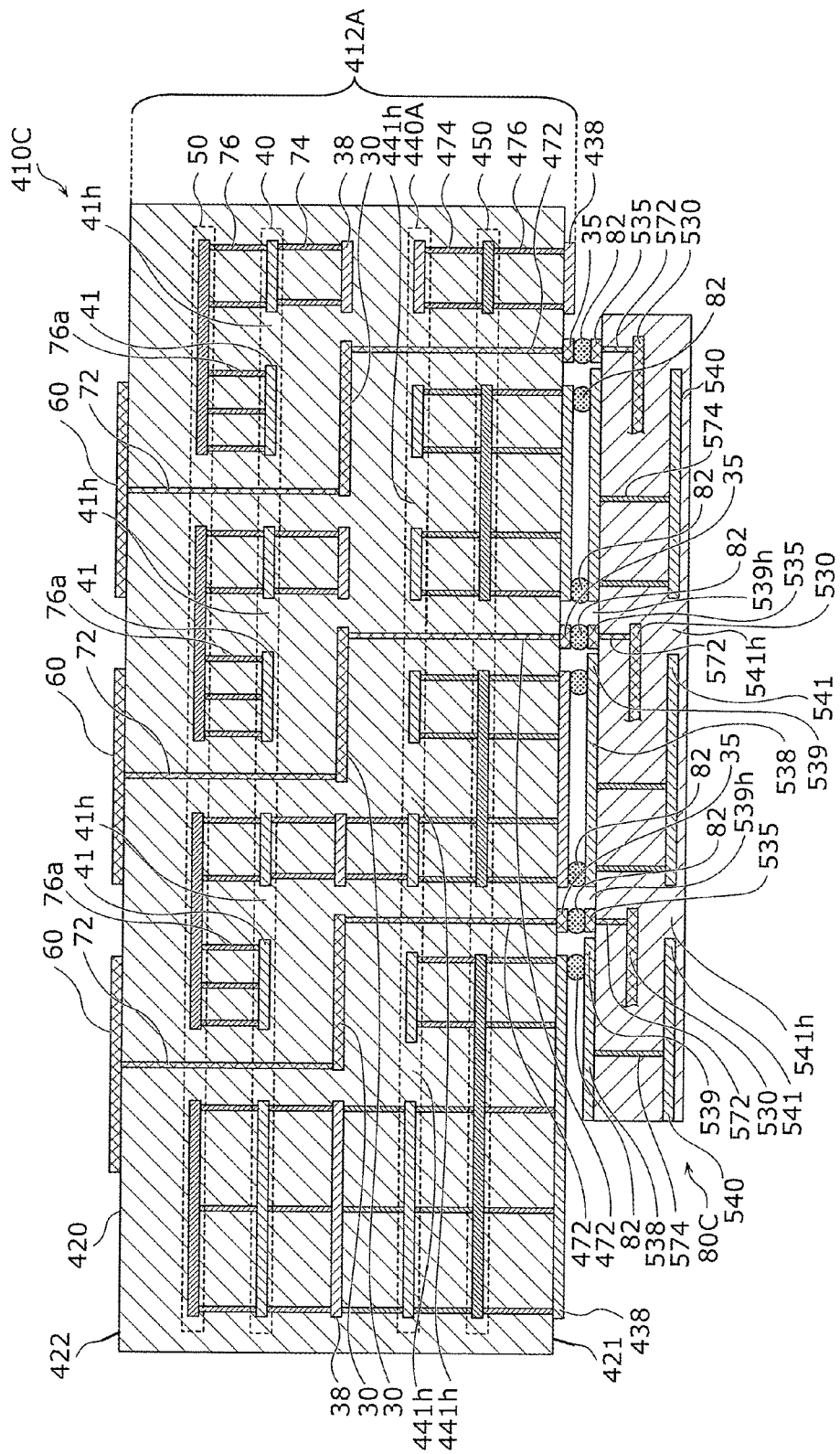

FIG. 25 is a cross-sectional view illustrating the basic configuration of an antenna module according to an eighteenth modification.

Figure 26:
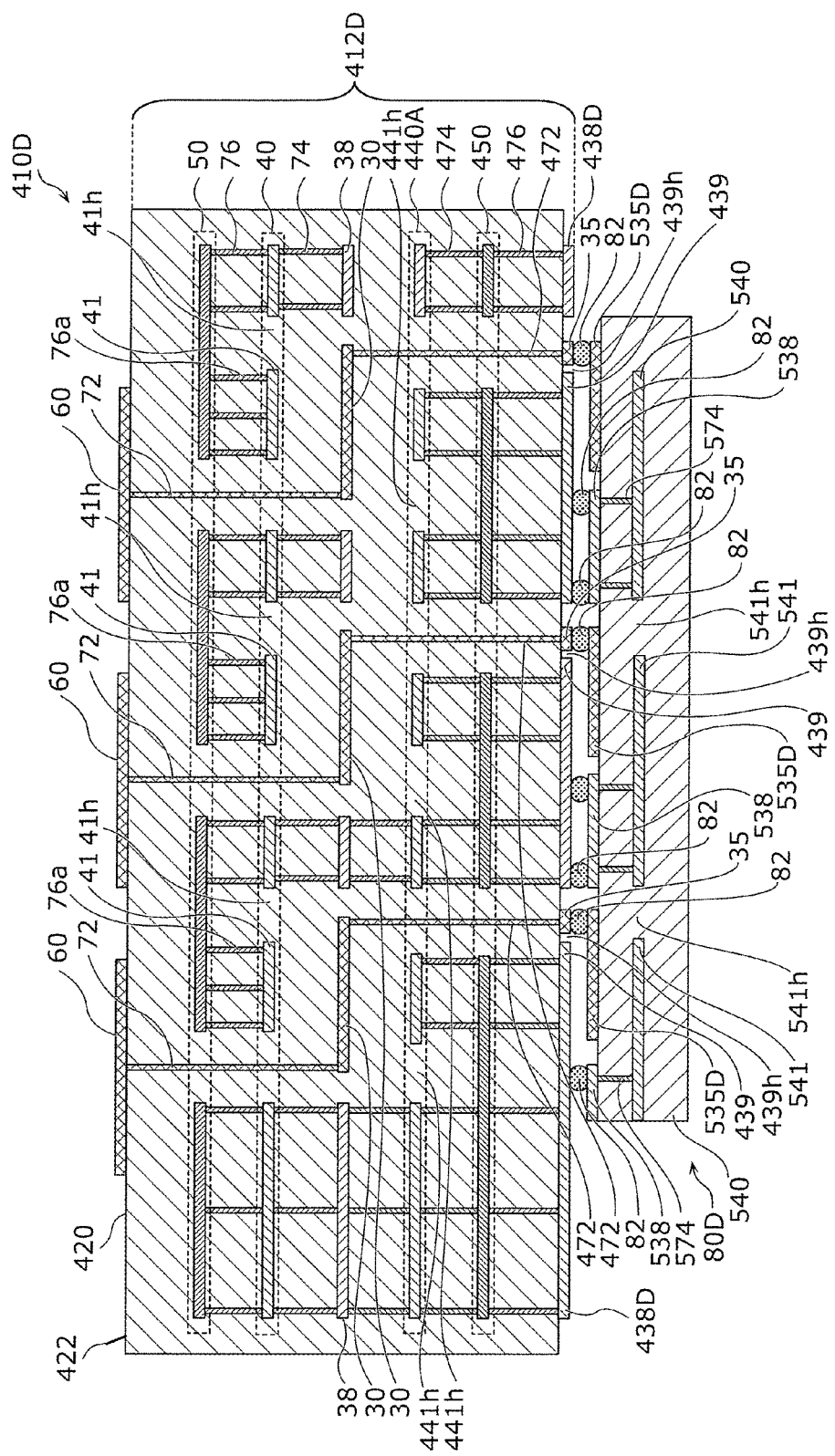

FIG. 26 is a cross-sectional view illustrating the basic configuration of an antenna module according to a nineteenth modification.

DETAILED DESCRIPTION OF THE DISCLOSURE

Embodiments of the present disclosure will herein be described in detail using examples with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure. Among the components in the embodiments described below, the components that are not described in the independent claims are described as optional components. In addition, the sizes or the ratios of the sizes of the components illustrated in the drawings are not necessarily strictly indicated. The same reference numerals are used in the respective drawings to identify substantially the same components and a duplicated description of such components may be omitted or simplified.

First Embodiment

A transmission line and an antenna module according to a first embodiment will now be described.

[1-1. Basic Configuration]

Figure 1:
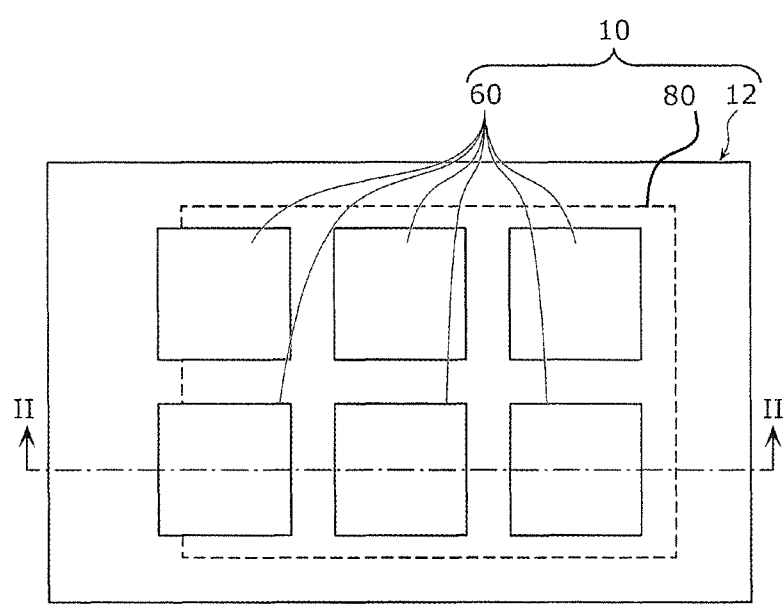
FIG. 1 is a plan view illustrating the external view of a transmission line and an antenna module according to a first embodiment.
Figure 2:
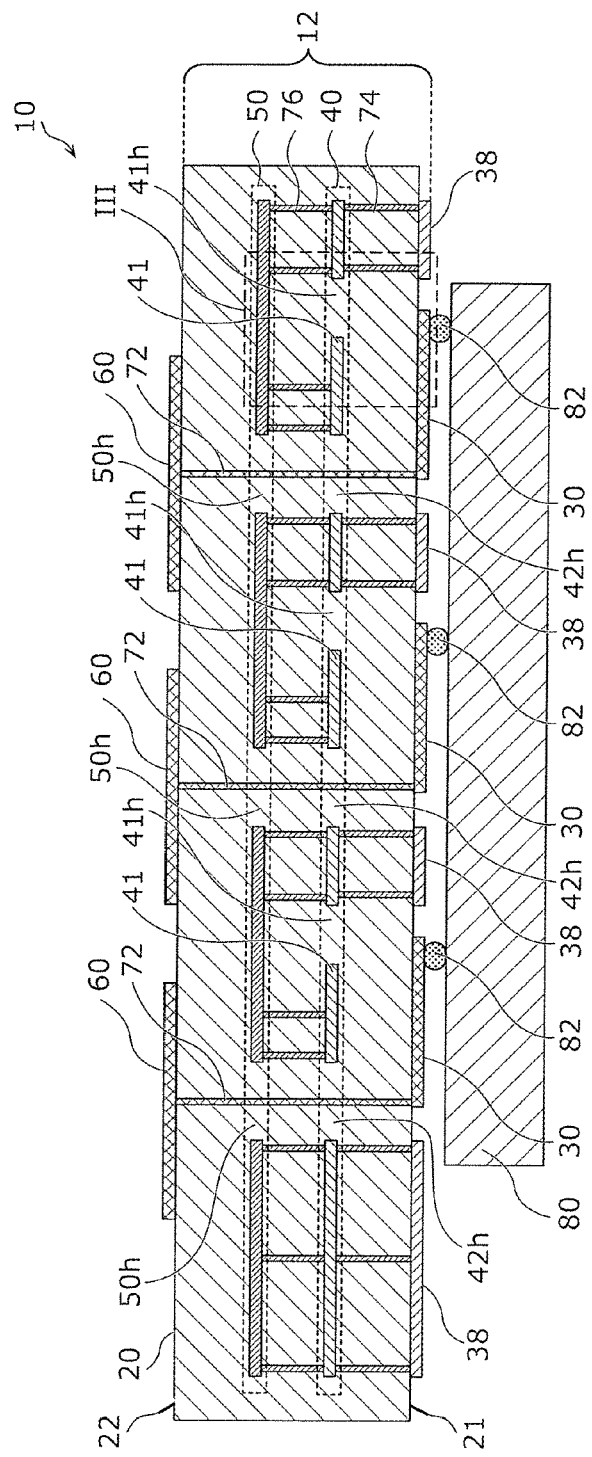
FIG. 2 is a cross-sectional view illustrating the basic configuration of the transmission line and the antenna module according to the first embodiment.
Figure 3:
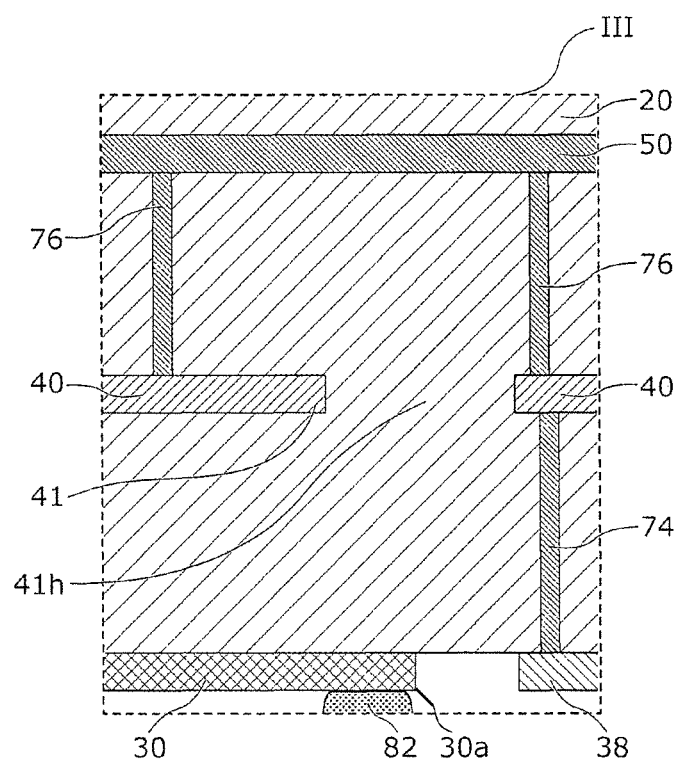
FIG. 3 is an enlarged cross-sectional view illustrating the configuration near a first end portion, which is one end portion of a signal pattern line of the transmission line according to the first embodiment.
Figure 5A:
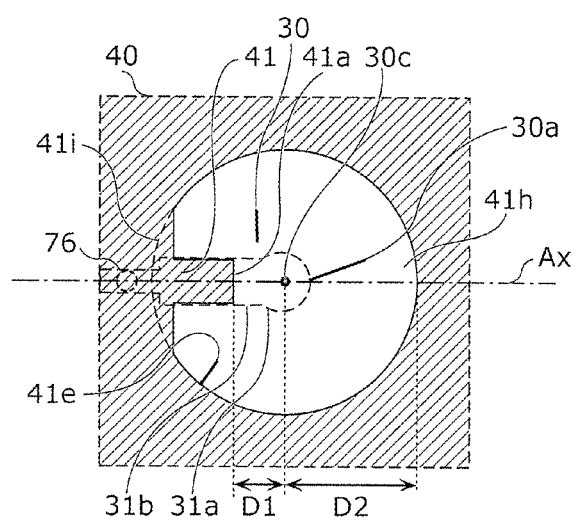
FIG. 5A is a plan view illustrating the relative position of the signal pattern line and the intermediate ground pattern conductor near the first end portion of the signal pattern line of the transmission line according to the first embodiment.
Figure 5B:
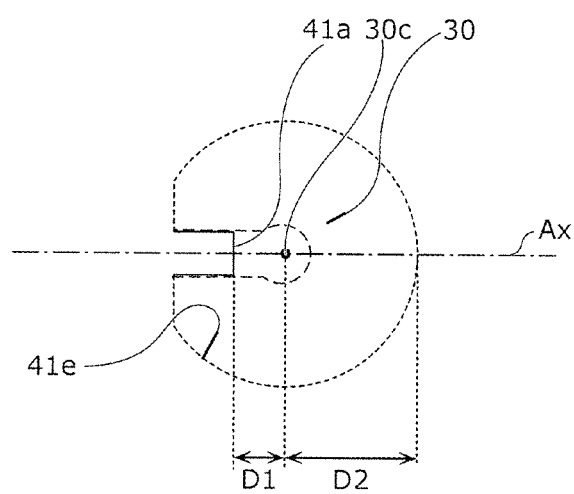
FIG. 5B is a plan view illustrating a first end edge of a first cavity portion according to the first embodiment.

The basic configuration of the transmission line and the antenna module according to the present embodiment will be described with reference to the drawings. FIG. 1 is a plan view illustrating the external view of a transmission line 12 and an antenna module 10 according to the present embodiment. The position where an integrated circuit 80 in the antenna module 10 is arranged is also indicated by a broken line in FIG. 1. FIG. 2 is a cross-sectional view illustrating the basic configuration of the transmission line 12 and the antenna module 10 according to the present embodiment. A cross-section taken along the II-II line in FIG. 1 is illustrated in FIG. 2. FIG. 3 is an enlarged cross-sectional view illustrating the configuration near a first end portion 30a, which is one end portion of a signal pattern line 30 of the transmission line 12 according to the present embodiment. The inside of a broken-line frame III illustrated in FIG. 2 is indicated in an enlarged manner in FIG. 3. FIG. 4 is a plan view illustrating the shapes of a ground pattern conductor 50, an intermediate ground pattern conductor 40, and the signal pattern line 30 near the first end portion 30a of the signal pattern line 30 of the transmission line 12 according to the present embodiment. FIG. 5A is a plan view illustrating the relative position of the signal pattern line 30 and the intermediate ground pattern conductor 40 near the first end portion 30a of the signal pattern line 30 of the transmission line 12 according to the present embodiment. FIG. 5B is a plan view illustrating a first end edge 41e of a first cavity portion 41h according to the present embodiment. FIG. 4, FIG. 5A, and FIG. 5B are plan views in a plan view of a multilayer substrate 20, and a central axis Ax of the signal pattern line 30 is also indicated in FIG. 4, FIG. 5A, and FIG. 5B. The plan views of the signal pattern line 30 and so on in the broken-line frame III illustrated in FIG. 2 are illustrated in FIG. 4 and FIG. 5A. In FIG. 5A, an area where the intermediate ground pattern conductor 40 is arranged is hatched and the outline of an area where the signal pattern line 30 is arranged is indicated by a broken line.

As illustrated in FIG. 1 and FIG. 2, the antenna module 10 includes the transmission line 12, multiple patch antennas 60 arranged in an array pattern, solder bumps 82, and the integrated circuit 80. As illustrated in FIG. 2, the transmission line 12 includes the multilayer substrate 20, the signal pattern lines 30, signal via hole lines 72, the ground pattern conductor 50, and the intermediate ground pattern conductor 40. In the present embodiment, the transmission line 12 further includes ground via hole conductors 74 and 76 and a signal-layer ground pattern conductor 38.

The multilayer substrate 20 is a substrate formed of a dielectric body and is formed by laminating multiple dielectric thin films. The multilayer substrate 20 has a first main surface 21 and a second main surface 22 positioned at the rear side of the first main surface 21. For example, a low temperature co-fired ceramics (LTCC) substrate is used as the multilayer substrate 20. Various conductors including the signal pattern line 30 are arranged on inner layers and surface layers of the multilayer substrate 20. The various conductors formed in and on the multilayer substrate 20 are made of Al, Cu, Au, Ag, or metal containing any of these alloys as a major component.

The signal pattern line 30 is a pattern conductor arranged on the multilayer substrate 20, as illustrated in FIG. 2 and FIG. 3. The signal pattern line 30 is a film conductor that is formed on a plane parallel to the first main surface 21 and the second main surface 22 of the multilayer substrate 20 at a certain position in a laminating direction of the multilayer substrate 20. The laminating direction means the direction in which the multiple thin films composing the multilayer substrate 20 are laminated, that is, the direction vertical to the first main surface 21 and the second main surface 22. In the present embodiment, as illustrated in FIG. 2, the signal pattern line 30 is arranged on the first main surface 21 of the multilayer substrate 20. The transmission line 12 includes multiple signal pattern lines 30. Each of the multiple signal pattern lines 30 has a first connection point 30c to which a signal conductor is connected, as illustrated in FIG. 4. The signal conductor extends from the signal pattern line 30 in a direction away from the intermediate ground pattern conductor 40 in the laminating direction of the multilayer substrate 20. In the present embodiment, the solder bump 82 is connected to the first connection point 30c of the signal pattern line 30 as the signal conductor. The solder bump 82 may be connected to the signal pattern line 30 in an area including the first connection point 30c, instead of the first connection point 30c. The first connection point 30c may be a center or a centroid of the area. The first connection point 30c is arranged in the first end portion 30a, which is one end portion of the signal pattern line 30. The first end portion 30a means an area of the signal pattern line 30 where the distance from one end of the signal pattern line 30 is shorter than or equal to the width of a portion (a wide width portion 31a of a strip line portion 31 described below in the present embodiment) including the one end. The signal pattern lines 30 are connected to multiple terminals of the integrated circuit 80 via the solder bumps 82 at the first connection points 30c and are connected to the signal via hole lines 72 near the other end portions.

The signal pattern line 30 includes the strip line portion 31 including the first end portion 30a and a coplanar line portion 32 arranged in a slit portion 38s formed in the signal-layer ground pattern conductor 38, as illustrated in FIG. 4.

The solder bumps 82 are conductors with which the transmission line 12 is connected to the integrated circuit 80. In the present embodiment, the solder bumps 82 are used as the signal conductors extending from the signal pattern lines 30 in the direction away from the intermediate ground pattern conductor 40 in the laminating direction of the multilayer substrate 20.

The signal via hole lines 72 are via hole conductors that are connected to the signal pattern lines 30 and that extends in the laminating direction of the multilayer substrate 20. The signal via hole lines 72 are connected to the corresponding patch antennas 60.

The signal-layer ground pattern conductor 38 is arranged at the same position as that of the signal pattern line 30 in the laminating direction of the multilayer substrate 20, as illustrated in FIG. 2. In other words, the signal-layer ground pattern conductor 38 is a pattern conductor arranged on the same layer as that of the signal pattern line 30. The signal-layer ground pattern conductor 38 is grounded to be kept at ground potential. The signal-layer ground pattern conductor 38 is arranged at a position that is not overlapped with the signal pattern line 30 in a plan view of the multilayer substrate 20 and is not in contact with the signal pattern line 30, as illustrated in FIG. 2 and FIG. 4.

As illustrated in FIG. 4, a cavity portion 38*h* is formed in the signal-layer ground pattern conductor 38. The strip line portion 31 of the signal pattern line 30 is arranged in the cavity portion 38*h*. In the present embodiment, the end edge of the cavity portion 38*h* has a circular arc around the first connection point 30*c* of the signal pattern line 30. Accordingly, the signal-layer ground pattern conductor 38 and the solder bump 82 forms a pseudo coaxial line. In addition, the slit portion 38*s* is formed in the signal-layer ground pattern conductor 38. The slit portion 38*s* is a portion of the signal-layer ground pattern conductor 38 partially missing in a strip shape in a plan view of the multilayer substrate 20. The coplanar line portion 32 of the signal pattern line 30 is arranged in the slit portion 38*s*.

The ground pattern conductor 50 is a pattern conductor arranged at a position different from that of the signal pattern line 30 in the laminating direction of the multilayer substrate 20, as illustrated in FIG. 2 and FIG. 3. The ground pattern conductor 50 is arranged on a layer different from that of the signal pattern line 30 in the multilayer substrate 20. The ground pattern conductor 50 is overlapped with the signal pattern line 30 in a plan view of the multilayer substrate 20. The ground pattern conductor 50 is grounded to be kept at the ground potential. In the present embodiment, as illustrated in FIG. 2, cavity portions 50*h* are formed in the ground pattern conductor 50 and the signal via hole lines 72 pass through the corresponding cavity portions 50*h*. Each cavity portion 50*h* has a circular shape in a plan view of the multilayer substrate 20. The dielectric body forming the multilayer substrate 20 is arranged in an area between the signal via hole line 72 and the ground pattern conductor 50 in the cavity portion 50*h*. This configuration enables the signal via hole line 72 to be used as the pseudo coaxial line.

The intermediate ground pattern conductor 40 is a pattern conductor arranged between the signal pattern line 30 and the ground pattern conductor 50 in the laminating direction of the multilayer substrate 20, as illustrated in FIG. 2 and FIG. 3. The intermediate ground pattern conductor 40 is arranged on a layer between the signal pattern line 30 and the ground pattern conductor 50 in the multilayer substrate 20. The intermediate ground pattern conductor 40 is electrically connected to the ground pattern conductor 50. The intermediate ground pattern conductor 40 is electrically connected to the ground pattern conductor 50 via the ground via hole conductors 76. In addition, the intermediate ground pattern conductor 40 is electrically connected to the signal-layer ground pattern conductor 38 via the ground via hole conductors 74. As illustrated in FIG. 5A, the first cavity portion 41*h* is formed in the intermediate ground pattern conductor 40 at a position overlapped with the first end portion 30*a* of the signal pattern line 30 in a plan view of the multilayer substrate 20. Conductors (for example, the signal via hole line 72) electrically connected to the signal pattern line 30 are not arranged in the first cavity portion 41*h*. The dielectric body forming the multilayer substrate 20 is arranged in the area in the first cavity portion 41*h*. In addition, as illustrated in FIG. 2, second cavity portions 42*h* through which the signal via hole lines 72 pass are formed in the intermediate ground pattern conductor 40. Each second cavity portion 42*h* has a circular shape in a plan view of the multilayer substrate 20. The dielectric body forming the multilayer substrate 20 is arranged in the area in the second cavity portion 42*h*.

As illustrated in FIG. 5A and FIG. 5B, in a plan view of the multilayer substrate 20, the first end edge 41*e*, which is the end edge of the first cavity portion 41*h* of the intermediate ground pattern conductor 40, has a first overlapping portion 41*a* overlapped with the signal pattern line 30. Referring to FIG. 5B, in the first end edge 41*e*, the first overlapping portion 41*a* is indicated by a solid line and the remaining portion is indicated by a dotted line. A distance D1 between the first overlapping portion 41*a* and the first connection point 30*c* is shorter than a distance D2 between any portion other than the first overlapping portion 41*a* of the first end edge 41*e* and the first connection point 30*c*. Here, the distance D1 between the first overlapping portion 41*a* and the first connection point 30*c* means a minimum distance between the first overlapping portion 41*a* and the first connection point 30*c*. As described above, the shape of the first cavity portion 41*h* of the intermediate ground pattern conductor 40 is adjusted so that the conductor included in the intermediate ground pattern conductor 40 positioned in the laminating direction with respect to the signal pattern line 30 is overlapped with a portion near the first end portion 30*a* of the signal pattern line 30 in a plan view of the multilayer substrate 20.

In the present embodiment, as illustrated in FIG. 4, the intermediate ground pattern conductor 40 has a first projecting portion 41 that projects toward the inside of the first cavity portion 41*h* along the signal pattern line 30 in a plan view of the multilayer substrate 20. The first end edge 41*e* of the first cavity portion 41*h* has a shape along the circular arc of a virtual circle 41*i* in a portion other than a portion near the first projecting portion 41. In other words, the first end edge 41*e* of the first cavity portion 41*h* has a portion having a shape along the circular arc of the virtual circle 41*i* and a portion having a shape that projects inward from the virtual circle 41*i* in the portion overlapped with the signal pattern line 30.

In the present embodiment, the first end edge 41*e* of the first cavity portion 41*h* of the intermediate ground pattern conductor 40 is overlapped with the strip line portion 31 of the signal pattern line 30 in the first projecting portion 41. The width of the first projecting portion 41 (the dimension in a direction perpendicular to the central axis Ax in FIG. 4) may be equal to the width of the signal pattern line 30 or may not be equal to the width thereof. For example, the width of the first projecting portion 41 may be greater than the width of a narrow width portion 31*b* of the signal pattern line 30 described below.

Each signal via hole line 72 is a via hole conductor that is connected to the corresponding signal pattern line 30 and that extends in the laminating direction of the multilayer substrate 20. The signal via hole line 72 passes through the intermediate ground pattern conductor 40 at a position different from that of the first cavity portion 41*h*. In the present embodiment, the signal via hole line 72 passes through the intermediate ground pattern conductor 40 in the second cavity portion 42h of the intermediate ground pattern conductor 40. In addition, the signal via hole line 72 passes through the ground pattern conductor 50 in the cavity portion 50h and extends to the patch antenna 60. The cross-sectional shapes of the signal via hole line 72 and the other via hole conductors of the transmission line 12 (that is, the cross-sectional shapes vertical to the laminating direction of the multilayer substrate 20) are not especially limited. In the present embodiment and other embodiments described below, each via hole conductor has a circular cross-sectional shape.

Each ground via hole conductor 74 is a via hole conductor with which the intermediate ground pattern conductor 40 is connected to the signal-layer ground pattern conductor 38. The transmission line 12 according to the present embodiment includes multiple ground via hole conductors 74.

Each ground via hole conductor 76 is a via hole conductor with which the intermediate ground pattern conductor 40 is connected to the ground pattern conductor 50. The transmission line 12 according to the present embodiment includes multiple ground via hole conductors 76.

Each patch antenna 60 is a radiation electrode that is arranged on the second main surface 22 of the multilayer substrate 20 and that is formed of a thin-film pattern conductor parallel to the second main surface 22. The antenna module 10 according to the present embodiment includes the multiple patch antennas 60 that are connected to the respective multiple signal via hole lines 72 of the transmission line 12 and that are arranged in an array pattern. Although each patch antenna 60 has a rectangular shape in a plan view of the multilayer substrate 20, as illustrated in FIG. 1, in the present embodiment, the patch antenna 60 may have, for example, a circular shape or a polygonal shape. In addition, the patch antenna 60 may be formed on an inner layer of the multilayer substrate 20 for prevention of oxidation or the like or a protective film may be formed over the patch antenna 60. Furthermore, the patch antenna 60 may be formed of a power supply conductor or a non-power supply conductor.

The integrated circuit 80 is a device that has at least one of a function to supply a signal to be transmitted to the patch antennas 60 to the signal pattern line 30 and a function to process a signal that is received with the patch antenna 60 and that is supplied through the signal pattern line 30. In the present embodiment, the integrated circuit 80 is a radio-frequency integrated circuit (RFIC). The integrated circuit 80 is not limited to a semiconductor chip, such as the RFIC. It is sufficient for the integrated circuit 80 to be a module in which devices composing the circuit are integrated. For example, the integrated circuit 80 includes the semiconductor chip and a module in which peripheral components concerning the operation of the semiconductor chip are integrated.

The integrated circuit 80 has multiple terminals that are arranged on the first main surface 21 of the multilayer substrate 20 and that are connected to the respective multiple signal pattern lines 30 of the transmission line 12. As described above, the integrated circuit 80 is arranged on the first main surface 21 of the multilayer substrate 20 and the multiple patch antennas 60 are arranged on the second main surface 22 of the multilayer substrate 20. In other words, the multiple patch antennas 60 are arranged on the second main surface 22, which is positioned at the rear side of the first main surface 21 of the multilayer substrate 20. Accordingly, since the distance between the multiple patch antenna 60 and the integrated circuit 80 is capable of being decreased, compared with a case in which the multiple patch antennas 60 and the integrated circuit 80 are arranged on the same main surface of the multilayer substrate 20, the loss of signals in the transmission line 12 is capable of being reduced. In addition, the antenna module 10 is capable of being reduced in size.

1-2. Effects and Advantages

Effects and advantages of the transmission line according to the present embodiment will now be described.

As described above, the solder bump 82, which is the signal conductor extending in the laminating direction of the multilayer substrate 20, is connected at the first connection point 30c arranged in the first end portion 30a of the signal pattern line 30 of the transmission line 12. Impedance mismatching occurs in a portion where the transmission direction of signals in the transmission line 12 is varied. In order to match the impedance in the solder bump 82 extending in the laminating direction of the multilayer substrate 20, means for providing a circular cavity in the intermediate ground pattern conductor 40 to form the pseudo coaxial line is considered. The cavity supposed in this case has the end edge along the virtual circle 41i around the first connection point in a plan view of the multilayer substrate 20. Since the intermediate ground pattern conductor 40 opposed to the vicinity of the first end portion 30a of the signal pattern line 30 does not exist although the impedance mismatching in the solder bump 82 is reduced with such a cavity, the impedance mismatching occurs near the first end portion 30a of the signal pattern line 30.

In the transmission line 12 according to the present embodiment, as illustrated in FIG. 5A and FIG. 5B, the first end edge 41e, which is the end edge of the first cavity portion 41h of the intermediate ground pattern conductor 40, has the first overlapping portion 41a overlapped with the signal pattern line 30 in a plan view of the multilayer substrate 20. The distance D1 between the first overlapping portion 41a and the first connection point 30c is shorter than the distance D2 between any portion other than the first overlapping portion 41a of the first end edge 41e and the first connection point 30c.

Accordingly, the portion that is not overlapped with the intermediate ground pattern conductor 40, in the portion near the first end portion 30a of the signal pattern line 30, in a plan view of the multilayer substrate 20 is capable of being reduced, compared with a case in which a cavity having an end edge along the virtual circle 41i around the first connection point 30c is formed in the intermediate ground pattern conductor 40 in a plan view of the multilayer substrate 20. Continuously forming the intermediate ground pattern conductor 40 from the outside to the inside of the virtual circle 41i in the intermediate ground pattern conductor 40 at the position opposed to the signal pattern line 30 in the above manner enables the impedance mismatching in the portion near the first end portion 30a of the signal pattern line 30 to be reduced.

In addition, in the transmission line 12, the intermediate ground pattern conductor 40 has the first projecting portion 41 projecting toward the inside of the first cavity portion 41h along the signal pattern line 30 in a plan view of the multilayer substrate 20. Accordingly, it is possible to adjust the impedance of the signal pattern line 30 in the area where the first projecting portion 41 is overlapped with the signal pattern line 30 in a plan view of the multilayer substrate 20. Adjusting the impedance of the signal pattern line 30 in the above manner enables the impedance mismatching near the first end portion 30a of the signal pattern line 30 to be reduced.

Furthermore, as illustrated in FIG. 5A, the signal pattern line 30 includes the wide width portion 31a including the first end portion 30a, and the narrow width portion 31b which is connected to the wide width portion 31a and which is narrower than the wide width portion 31a. The first projecting portion 41 of the intermediate ground pattern conductor 40 is overlapped with the narrow width portion 31b and is not overlapped with the wide width portion 31a in a plan view of the multilayer substrate 20. Adjusting the shape of the first projecting portion 41 and the relative position between the first projecting portion 41 and the signal pattern line 30 in accordance with the shape of the signal pattern line 30 in the above manner enables the impedance of the signal pattern line 30 to be adjusted to a desired value.

As described above, with the transmission line 12 according to the present embodiment, it is possible to reduce the impedance mismatching in the signal pattern lines 30. Since the antenna module 10 according to the present embodiment includes the transmission line 12 capable of reducing the impedance mismatching, it is possible to reduce return loss and passband loss in the transmission line 12 with which the antenna module 10 is connected to the integrated circuit 80.

1-3. Modification

Next, a transmission line according to a modification of the first embodiment will now be described. The transmission line according to the present modification differs from the transmission line 12 according to the first embodiment in that the transmission line according to the present modification has a configuration for reducing parasitic capacitance occurring in the intermediate ground pattern conductor. The configuration of the transmission line according to the present modification will be described with reference to the drawings, focusing on the difference from the transmission line 12 according to the first embodiment.

Figure 6:
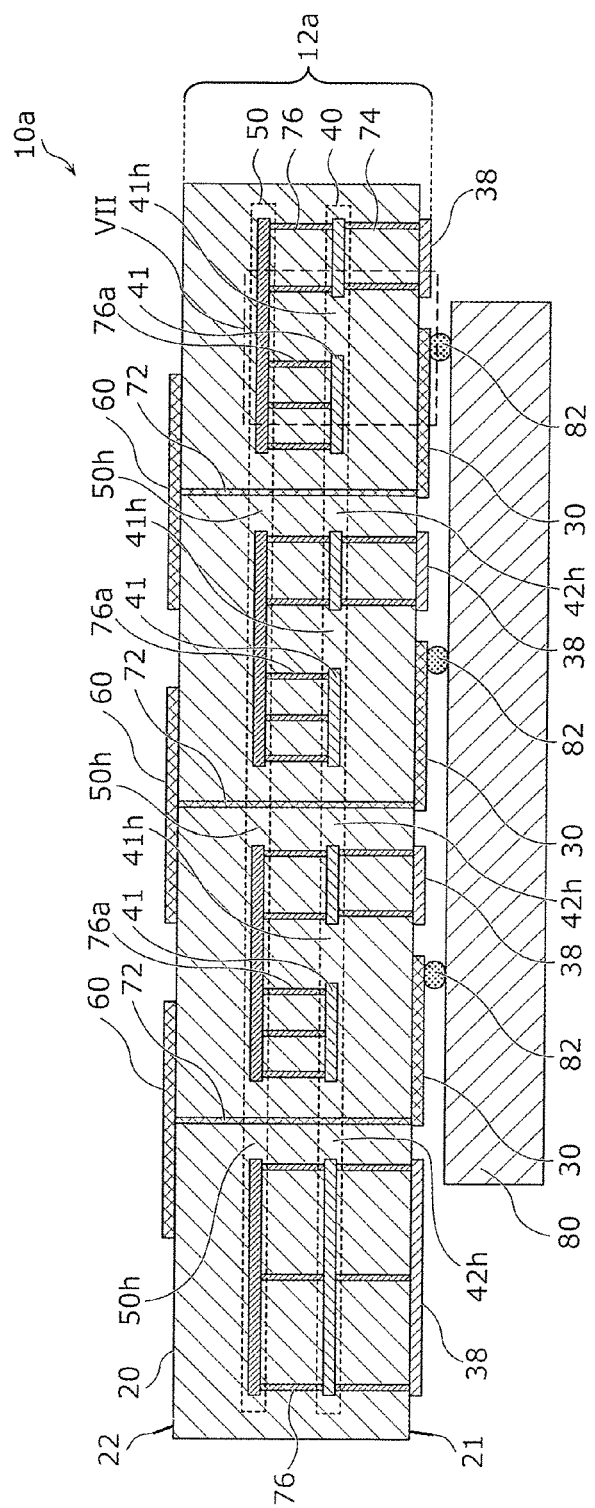
FIG. 6 is a cross-sectional view illustrating the basic configuration of a transmission line and an antenna module according to a modification of the first embodiment.
Figure 7:
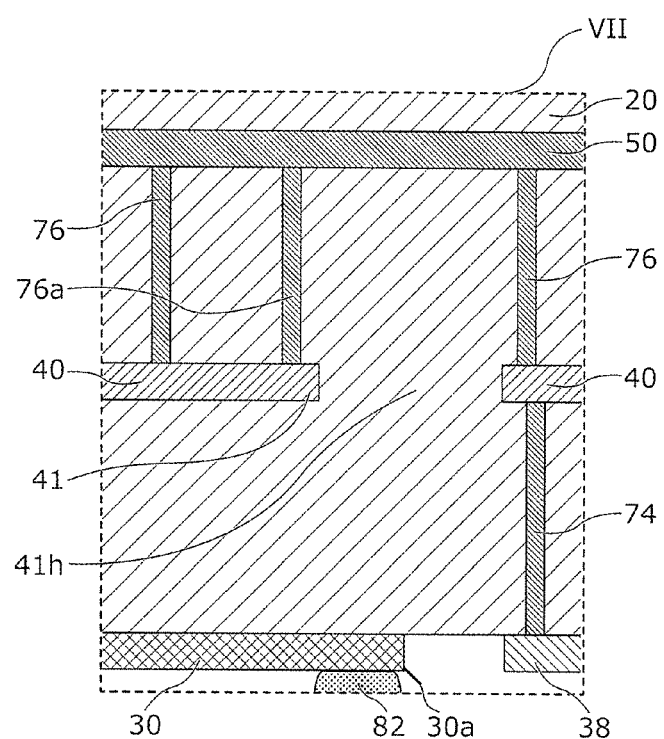
FIG. 7 is an enlarged cross-sectional view illustrating the configuration near the first end portion, which is one end portion of the signal pattern line of the transmission line according to the modification of the first embodiment.
Figure 8:
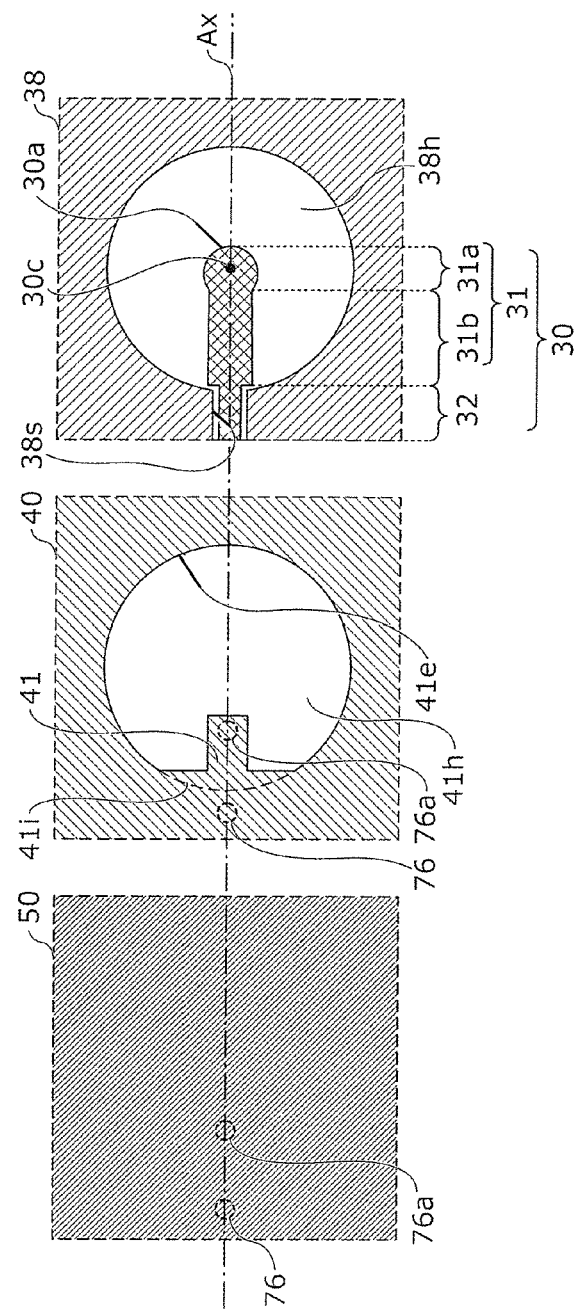
FIG. 8 is a plan view illustrating the shapes of the ground pattern conductor, the intermediate ground pattern conductor, and the signal pattern line of the transmission line according to the modification of the first embodiment.

FIG. 6 is a cross-sectional view illustrating the basic configuration of a transmission line 12a and an antenna module 10a according to the present modification. The cross-sectional view of the transmission line 12a and the antenna module 10a on the same cross section as that of the cross-sectional view illustrated in FIG. 2 is illustrated in FIG. 6. FIG. 7 is an enlarged cross-sectional view illustrating the configuration near the first end portion 30a, which is one end portion of the signal pattern line 30 of the transmission line 12a according to the present modification. The inside of a broken-line frame VII illustrated in FIG. 6 is indicated in an enlarged manner in FIG. 7. FIG. 8 is a plan view illustrating the shapes of the ground pattern conductor 50, the intermediate ground pattern conductor 40, and the signal pattern line 30 of the transmission line 12a according to the present modification. FIG. 8 is a plan view illustrating the shapes of the ground pattern conductor 50 and the intermediate ground pattern conductor 40 at a position overlapped with the signal pattern line 30 illustrated in the plan view in a plan view of the multilayer substrate 20. The plan view of the signal pattern line 30 and so on in the broken-line frame VII illustrated in FIG. 6 is illustrated in FIG. 8. As illustrated in FIG. 6 and FIG. 8, the transmission line 12a of the present modification differs from the transmission line 12 according to the first embodiment in that the transmission line 12a of the present modification includes first ground via hole conductors 76a.

Each first ground via hole conductor 76a is a via hole conductor which is arranged in a portion of the intermediate ground pattern conductor 40, overlapped with the signal pattern line 30, in a plan view of the multilayer substrate 20, and with which the intermediate ground pattern conductor 40 is connected to the ground pattern conductor 50, as illustrated in FIG. 6 to FIG. 8. The first ground via hole conductor 76a is arranged in the virtual circle 41i in a plan view of the multilayer substrate 20. In the present modification, the first ground via hole conductor 76a is arranged in the first projecting portion 41 of the intermediate ground pattern conductor 40.

Figure 9:
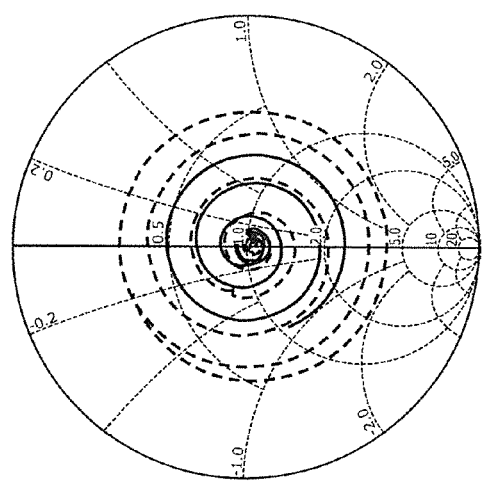
FIG. 9 is a Smith chart indicating impedance characteristics viewed from the input side (the integrated circuit side) of the transmission line according to the first embodiment.
Figure 10:
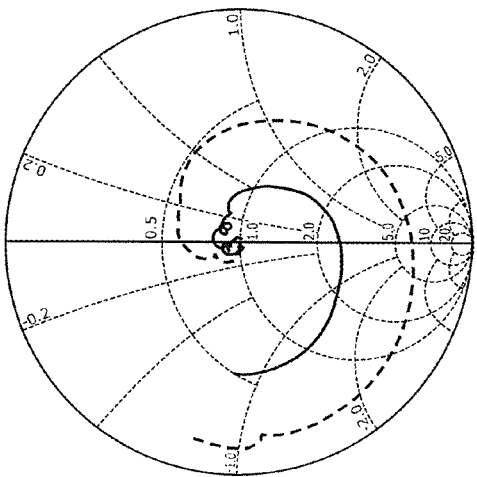
FIG. 10 is a Smith chart indicating impedance characteristics viewed from the output side (the patch antennas) of the transmission line according to the first embodiment.
Figure 11:
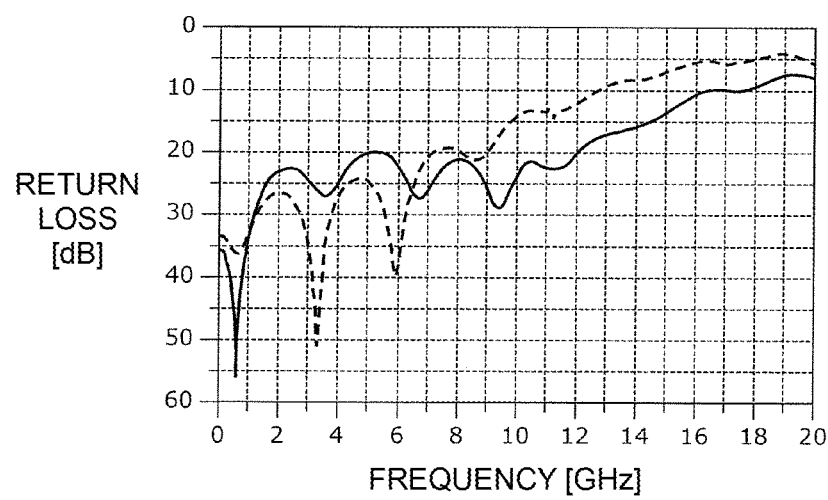
FIG. 11 is a graph indicating the relationship between return loss and frequency in the transmission line according to the first embodiment.
Figure 12:
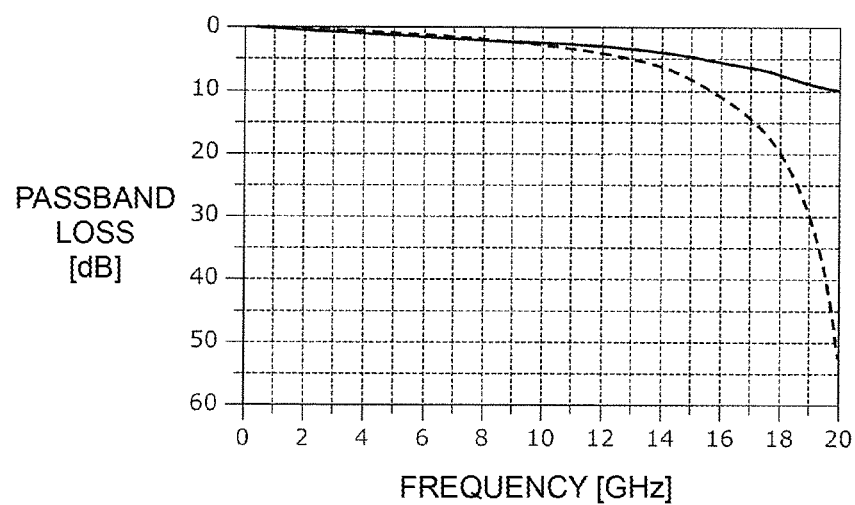
FIG. 12 is a graph indicating the relationship between passband loss and the frequency in the transmission line according to the first embodiment.

Characteristics of the transmission line 12a according to the present modification will now be described using the simulation results while comparing the characteristics of the transmission line 12a according to the present modification with the characteristics of the transmission line 12 according to the first embodiment. FIG. 9 and FIG. 10 are Smith charts indicating impedance characteristics viewed from the input side (the integrated circuit 80 side) and the output side (the patch antennas 60 side), respectively, of the transmission line 12a according to the present modification. The impedance characteristics in a frequency band not lower than 10 MHz and not higher than 20 GHz are indicated in FIG. 9 and FIG. 10. FIG. 11 is a graph indicating the relationship between the return loss and the frequency in the transmission line 12a according to the present modification, and FIG. 12 is a graph indicating the relationship between the passband loss and the frequency in the transmission line 12a according to the present modification. In FIG. 9 to FIG. 12, the characteristics of the transmission line 12a according to the present modification are indicated by solid lines and the characteristics of the transmission line 12 according to the first embodiment are indicated by broken lines.

As illustrated in FIG. 9 and FIG. 10, the impedance of the transmission line 12a according to the present modification is closer to characteristic impedance (50Ω), compared with the impedance of the transmission line 12 according to the first embodiment. As illustrated in FIG. 11 and FIG. 12, at least in a frequency band not lower than 10 GHz, the return loss and the passband loss of the transmission line 12a according to the present modification are smaller than those of the transmission line 12 according to the first embodiment. In the present modification, for example, at a frequency of 12 GHz, the return loss and the passband loss are capable of being improved by 8.1 dB and 0.48 dB, respectively, compared with those in the first embodiment. Since the impedance mismatching is capable of being reduced in the transmission line 12a according to the present modification, compared with that in the transmission line 12 according to the first embodiment, as described above, it is possible to further reduce the return loss and the passband loss. Such advantages are achieved because the parasitic capacitance occurring between the portion in the intermediate ground pattern conductor 40 of the transmission line 12a according to the present modification, which affects the impedance of the signal pattern line 30, and the ground pattern conductor 50 is capable of being reduced with the first ground via hole conductors 76a.

In addition, in the transmission line 12a, the first ground via hole conductor 76a is arranged in the first projecting portion 41, as illustrated in FIG. 8. Although the parasitic capacitance is likely to occur between the intermediate ground pattern conductor 40 and the ground pattern conductor 50 because the first projecting portion 41 is an end portion projecting from the intermediate ground pattern conductor 40, connecting the first projecting portion 41 to the ground pattern conductor 50 with the first ground via hole conductor 76a enables the parasitic capacitance in the first projecting portion 41 to be reduced. Accordingly, it is possible to reduce the impedance mismatching caused by the parasitic capacitance of the signal pattern line 30.

Second Embodiment

A transmission line and an antenna module according to a second embodiment will now be described. The transmission line according to the present embodiment differs from the transmission line 12a according to the modification of the first embodiment in the configuration of portions in the ground pattern conductor and the intermediate ground pattern conductor, through which a signal via hole line passes, and the transmission line according to the present embodiment is equivalent to the transmission line 12a according to the modification of the first embodiment in the remaining configuration. The transmission line and the antenna module according to the present embodiment are described below, focusing on the difference from the modification of the first embodiment.

2-1. Configuration

Figure 13:
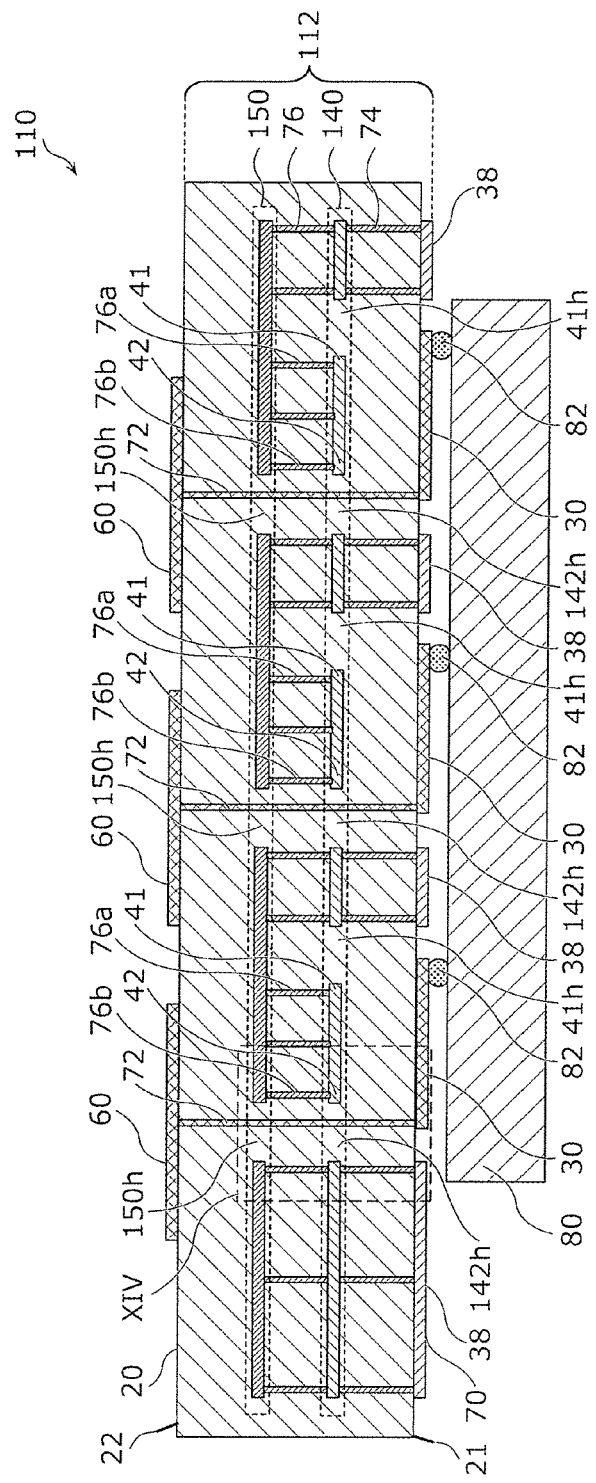
FIG. 13 is a cross-sectional view illustrating the configuration of a transmission line and an antenna module according to a second embodiment.
Figure 14:
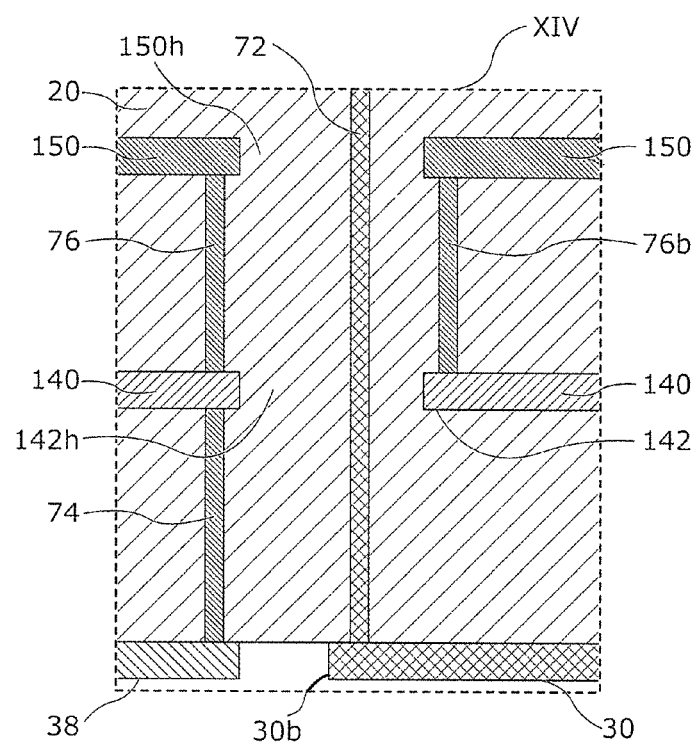
FIG. 14 is an enlarged cross-sectional view illustrating the configuration near a second end portion, which is the other end portion of the signal pattern line of the transmission line according to the second embodiment.
Figure 16A:
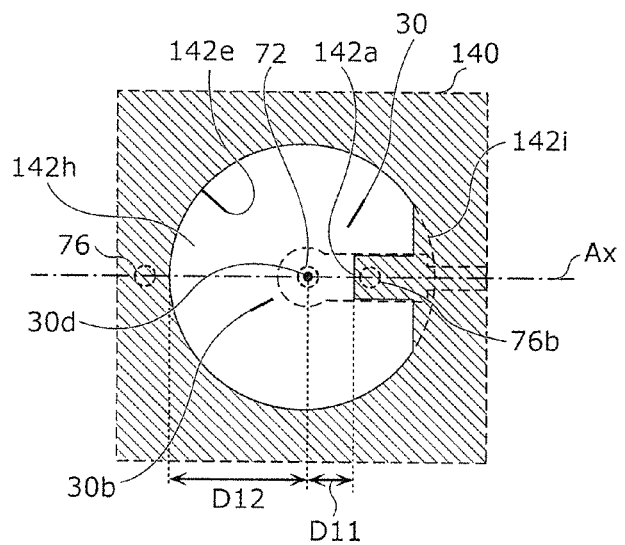
FIG. 16A is a plan view illustrating the relative position of the signal pattern line and the intermediate ground pattern conductor in an end portion of the signal pattern line of the transmission line according to the second embodiment.
Figure 16B:
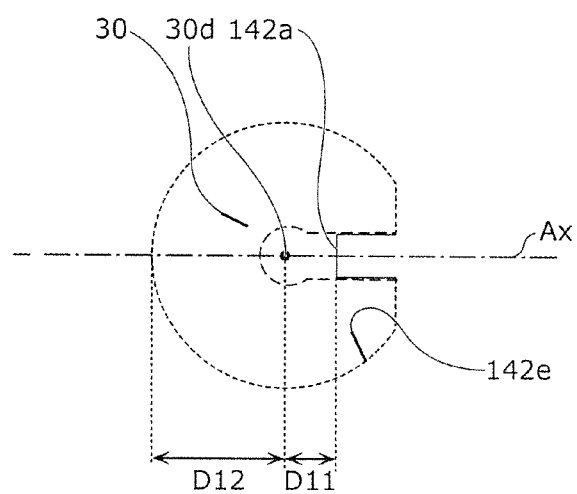
FIG. 16B is a plan view illustrating a second end edge of a second cavity portion according to the second embodiment.

The configuration of the transmission line and the antenna module according to the present embodiment will be described with reference to the drawings. FIG. 13 is a cross-sectional view illustrating the configuration of a transmission line 112 and an antenna module 110 according to the present embodiment. The cross-sectional view of the transmission line 112 and the antenna module 110 on the same cross section as that of the cross-sectional view illustrated in FIG. 2 is illustrated in FIG. 13. FIG. 14 is an enlarged cross-sectional view illustrating the configuration near a second end portion 30b, which is the other end portion of the signal pattern line 30 of the transmission line 112 according to the present embodiment. The inside of a broken-line frame XIV illustrated in FIG. 13 is indicated in an enlarged manner in FIG. 14. FIG. 15 is a plan view illustrating the shapes of a ground pattern conductor 150, an intermediate ground pattern conductor 140, and the signal pattern line 30 near the second end portion 30b of the signal pattern line 30 of the transmission line 112 according to the present embodiment. FIG. 16A is a plan view illustrating the relative position of the signal pattern line 30 and the intermediate ground pattern conductor 140 in an end portion of the signal pattern line 30 of the transmission line 112 according to the present embodiment. FIG. 16B is a plan view illustrating a second end edge 142e of a second cavity portion 142h according to the present embodiment. FIG. 15, FIG. 16A, and FIG. 16B are plan views in a plan view of a multilayer substrate 20, and the central axis Ax of the signal pattern line 30 is also indicated in FIG. 15, FIG. 16A, and FIG. 16B. The plan views of the signal pattern line 30 and so on in the broken-line frame XIV illustrated in FIG. 13 are illustrated in FIG. 15 and FIG. 16A. In FIG. 16A, an area where the intermediate ground pattern conductor 140 is arranged is hatched, and the outline of an area where the signal pattern line 30 is arranged is indicated by a broken line.

As illustrated in FIG. 13, the antenna module 110 includes the transmission line 112, the multiple patch antennas 60 arranged in an array pattern, the solder bumps 82, and the integrated circuit 80. The transmission line 112 includes the multilayer substrate 20, the signal pattern lines 30, the signal via hole lines 72, the ground pattern conductor 150, and the intermediate ground pattern conductor 140. In the present embodiment, the transmission line 112 further includes the ground via hole conductors 74 and 76, the first ground via hole conductors 76a, second ground via hole conductors 76b, and the signal-layer ground pattern conductor 38.

The intermediate ground pattern conductor 140 according to the present embodiment is electrically connected to the ground pattern conductor 150 via the ground via hole conductors 76 and the first ground via hole conductors 76a, as illustrated in FIG. 13 and FIG. 14. The intermediate ground pattern conductor 140 is further electrically connected to the ground pattern conductor 150 via the second ground via hole conductors 76b. As illustrated in FIG. 16A, the second cavity portion 142h is formed in the intermediate ground pattern conductor 140 at a position overlapped with the second end portion 30b, which is the other end portion of the signal pattern line 30 (the end portion positioned at the opposite side of the first end portion 30a), in a plan view of the multilayer substrate 20. The second end portion 30b means an area of the signal pattern line 30 where the distance from the other end (the end positioned at the opposite side of the first end portion 30a) of the signal pattern line 30 is shorter than or equal to the width of a portion (the wide width portion 31a of the strip line portion 31 described below in the present embodiment) including the other end, in the signal pattern line 30. The signal via hole line 72 is arranged in the second cavity portion 142h. In other words, the signal via hole line 72 passes through the intermediate ground pattern conductor 140 in the second cavity portion 142h.

As illustrated in FIG. 15, the signal pattern line 30 has a second connection point 30d to which the signal via hole line 72 extending from the signal pattern line 30 in the laminating direction of the multilayer substrate 20 is connected. The signal via hole line 72 may be connected to the signal pattern line 30 in an area including the second connection point 30d, instead of the second connection point 30d. The second connection point 30d may be a center or a centroid of the area. The second connection point 30d is arranged in the second end portion 30b. The signal pattern line 30 includes the strip line portion 31 including the second end portion 30b and the coplanar line portion 32, as in the configuration near the first end portion 30a described in the first embodiment. The strip line portion 31 includes the wide width portion 31a including the second end portion 30b, and the narrow width portion 31b which is connected to the wide width portion 31a and which is narrower than the wide width portion 31a.

As illustrated in FIG. 16A and FIG. 16B, in a plan view of the multilayer substrate 20, the second end edge 142e, which is the end edge of the second cavity portion 142h of the intermediate ground pattern conductor 140, has a second overlapping portion 142a overlapped with the signal pattern line 30. Referring to FIG. 16B, in the second end edge 142e, the second overlapping portion 142a is indicated by a solid line and the remaining portion is indicated by a dotted line. In the present embodiment, the intermediate ground pattern conductor 140 is overlapped with the strip line portion 31 of the signal pattern line 30 in a second projecting portion 142. A distance D11 between the second overlapping portion 142a and the second connection point 30d is shorter than a distance D12 between any portion other than the second overlapping portion 142a of the second end edge 142e and the second connection point 30d. In other words, the shape of the second cavity portion 142h of the intermediate ground pattern conductor 140 is adjusted so that the conductor included in the intermediate ground pattern conductor 140 positioned in the laminating direction with respect to the signal pattern line 30 is overlapped with a portion near the second end portion 30b of the signal pattern line 30 in a plan view of the multilayer substrate 20.

In the present embodiment, as illustrated in FIG. 15, the intermediate ground pattern conductor 140 has the second projecting portion 142, which projects toward the inside of the second cavity portion 142h along the signal pattern line 30 in a plan view of the multilayer substrate 20. The second end edge 142e of the second cavity portion 142h has a shape along the circular arc of a virtual circle 142i around the second connection point 30d in a portion other than a portion near the second projecting portion 142. In other words, the second end edge 142e of the second cavity portion 142h has a portion having a shape along the circular arc of the virtual circle 142i and a portion having a shape that projects inward from the virtual circle 142i in the portion overlapped with the signal pattern line 30.

A cavity portion 150h is formed in the ground pattern conductor 150 according to the present embodiment at a position overlapped with the second end portion 30b of the signal pattern line 30 in a plan view of the multilayer substrate 20, as illustrated in FIG. 15. The signal via hole line 72 is arranged in the cavity portion 150h. In other words, the signal via hole line 72 passes through the ground pattern conductor 150 in the cavity portion 150h. In addition, the ground pattern conductor 150 has a projecting portion 151 that projects toward the inside of the cavity portion 150h along the signal pattern line 30 in a plan view of the multilayer substrate 20. An end edge 150e of the cavity portion 150h has a shape along the circular arc of a virtual circle 150i around the second connection point 30d in a portion other than a portion near the projecting portion 151. In other words, the end edge 150e of the cavity portion 150h has a portion having a shape along the circular arc of the virtual circle 150i and a portion having a shape that projects inward from the virtual circle 150i in the portion overlapped with the signal pattern line 30. As described above, the cavity portion 150h of the ground pattern conductor 150 according to the present embodiment has a shape similar to that of the second cavity portion 142h of the intermediate ground pattern conductor 140.

Each second ground via hole conductor 76b is a via hole conductor which is arranged at a position of the intermediate ground pattern conductor 140, overlapped with the signal pattern line 30, and with which the intermediate ground pattern conductor 140 is connected to the ground pattern conductor 150 in a plan view of the multilayer substrate 20. The second ground via hole conductor 76b is arranged in the virtual circle 142i in a plan view of the multilayer substrate 20. In the present embodiment, the second ground via hole conductor 76b is arranged in the second projecting portion 142.

2-2. Effects and Advantages

As described above, in the transmission line 112 according to the present embodiment, the second end edge 142e, which is the end edge of the second cavity portion 142h of the intermediate ground pattern conductor 140, has the second overlapping portion 142a overlapped with the signal pattern line 30 in a plan view of the multilayer substrate 20. In the present embodiment, the intermediate ground pattern conductor 140 is overlapped with the strip line portion 31 of the signal pattern line 30 in the second projecting portion 142. The distance D11 between the second overlapping portion 142a and the second connection point 30d is shorter than the distance D12 between any portion other than the second overlapping portion 142a of the second end edge 142e and the second connection point 30d.

The signal via hole line 72 extending in the laminating direction of the multilayer substrate 20 is connected at the second connection point 30d arranged in the second end portion 30b of the signal pattern line 30 of the transmission line 112 according to the present embodiment in the above manner. The impedance mismatching occurs in a portion where the transmission direction of signals in the transmission line 112 is varied. In order to match the impedance in the signal via hole line 72 passing through the intermediate ground pattern conductor 140, means for providing a circular cavity in the intermediate ground pattern conductor 140 to form the pseudo coaxial line is considered. The cavity supposed in this case has the end edge along the virtual circle 142i around the second connection point 30d in a plan view of the multilayer substrate 20. Since the intermediate ground pattern conductor opposed to the vicinity of the second end portion of the signal pattern line 30 does not exist although the impedance mismatching in the signal via hole line 72 is reduced with such a cavity, the impedance mismatching occurs near the second end portion of the signal pattern line. In the transmission line 112 according to the present embodiment, the second end edge 142e of the second cavity portion 142h of the intermediate ground pattern conductor 140 has the second overlapping portion 142a overlapped with the signal pattern line 30 in a plan view of the multilayer substrate 20. The distance D11 between the second overlapping portion 142a and the second connection point 30d is shorter than the distance D12 between any portion other than the second overlapping portion 142a of the second end edge 142e and the second connection point 30d. Accordingly, the portion that is not overlapped with the intermediate ground pattern conductor 140, in the portion near the second end portion 30b of the signal pattern line 30, is capable of being reduced, compared with a case in which a cavity having an end edge along the virtual circle 142i around the second connection point 30d is formed in the intermediate ground pattern conductor 140 in a plan view of the multilayer substrate 20. Continuously forming the intermediate ground pattern conductor 140 from the outside to the inside of the virtual circle 142i in the intermediate ground pattern conductor 140 at the position opposed to the signal pattern line 30 in the above manner enables the impedance mismatching in the portion near the second end portion 30b of the signal pattern line 30 to be reduced.

In addition, in the transmission line 112, the intermediate ground pattern conductor 140 has the second projecting portion 142 projecting toward the inside of the second cavity portion 142h along the signal pattern line 30 in a plan view of the multilayer substrate 20. Accordingly, it is possible to adjust the impedance of the signal pattern line 30 in the area where the second projecting portion 142 is overlapped with the signal pattern line 30 in a plan view of the multilayer substrate 20. Adjusting the impedance of the signal pattern line 30 in the above manner enables the impedance mismatching near the second end portion 30b of the signal pattern line 30 to be reduced.

Furthermore, the transmission line 112 includes the second ground via hole conductors 76b which are arranged in the positions of the intermediate ground pattern conductor 140, overlapped with the signal pattern line 30, in a plan view of the multilayer substrate 20 and with which the intermediate ground pattern conductor 140 is connected to the ground pattern conductor 150. The same advantages as in the first ground via hole conductors 76a according to the modification of first embodiment are capable of being achieved with the second ground via hole conductors 76b. In other words, the parasitic capacitance occurring between the portions in the intermediate ground pattern conductor 140, which affect the impedance of the signal pattern line 30, and the ground pattern conductor 150 is capable of being reduced with the second ground via hole conductors 76b. Accordingly, it is possible to reduce the impedance mismatching in the signal pattern lines 30.

In the present embodiment, each second ground via hole conductor 76b is arranged in the second projecting portion 142. Although the potential of the second projecting portion 142 is likely to vary due to the influence of the surrounding electromagnetic field because the second projecting portion 142 is the end portion projecting from the intermediate ground pattern conductor 140, connecting the second projecting portion 142 to the ground pattern conductor 150 with the second ground via hole conductor 76b enables the parasitic capacitance occurring between the second projecting portion 142 and the ground pattern conductor 150 to be reduced. Accordingly, it is possible to reduce the impedance mismatching in the signal pattern lines 30.

Other Embodiments

Although the transmission lines and the antenna modules according to the first and second embodiments of the present disclosure are described above, the present disclosure is not limited to the embodiments described above. Other embodiments realized by combining arbitrary components in the above embodiments, modifications realized by making various changes supposed by a person skilled in the art to the above embodiments without departing from the spirit and scope of the present disclosure, and various devices including the transmission line and the antenna module according to the present disclosure are also included in the present disclosure.

For example, although the transmission line according to each embodiment includes the signal via hole line, the transmission line may not include the signal via hole line.

Although the patch antennas according to each embodiment are arranged on the second main surface of the multilayer substrate, that is, on the surface layer of the multilayer substrate, the position where the patch antennas are arranged is not limited to this. It is sufficient for the patch antennas to be arranged at the second main surface side with respect to the first main surface of the multilayer substrate. For example, the patch antennas may be arranged on an inner layer of the multilayer substrate.

Figure 17A:
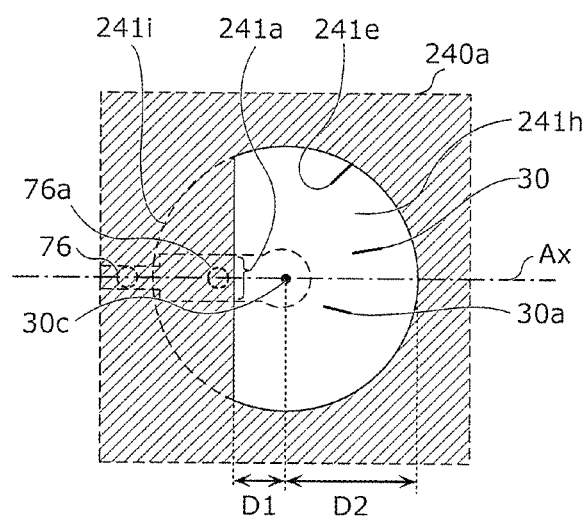
FIG. 17A is a plan view illustrating the shape of a first cavity portion of an intermediate ground pattern conductor according to a first modification.

Although the intermediate ground pattern conductors have the first projecting portion 41 and the second projecting portion 142 in the first cavity portion 41h and the second cavity portion 142h, respectively, in the above embodiments, the configurations of the intermediate ground pattern conductors are not limited to these. For example, the transmission line 12 according to the first embodiment may have the configuration of an intermediate ground pattern conductor 240a illustrated in FIG. 17A, instead of the intermediate ground pattern conductor 40. FIG. 17A is a plan view illustrating the shape of a first cavity portion 241h of the intermediate ground pattern conductor 240a according to a first modification. As illustrated in FIG. 17A, the intermediate ground pattern conductor 240a may not have the first projecting portion in the first cavity portion 241h. More specifically, a first end edge 241e, which is the end edge of the first cavity portion 241h, has a portion having a shape along the circular arc of a virtual circle 241i and a portion having a shape along the chord of the virtual circle 241i. The intermediate ground pattern conductor 240a illustrated in FIG. 17A is overlapped with the signal pattern line 30 in an area inside the virtual circle 241i in a plan view of the multilayer substrate 20. In a plan view of the multilayer substrate 20, the first end edge 241e has a first overlapping portion 241a overlapped with the signal pattern line 30. The distance D1 between the first overlapping portion 241a and the first connection point 30c is shorter than the distance D2 between any portion other than the first overlapping portion 241a of the first end edge 241e and the first connection point 30c. In addition, in a plan view of the multilayer substrate 20, the first ground via hole conductor 76a is arranged in an area that is inside the virtual circle 241i of the intermediate ground pattern conductor 240a and that is overlapped with the signal pattern line 30. Also in the transmission line including the intermediate ground pattern conductor 240a, the same advantages as in the transmission line 12 according to the first embodiment and the transmission line 12a according to the modification of the first embodiment are achieved. Similarly, the intermediate ground pattern conductor 140 according to the second embodiment may not have the second projecting portion 142 in the second cavity portion 142h.

The configuration of the intermediate ground pattern conductor is not limited to the configurations of the examples described above. Other modifications of the intermediate ground pattern conductor will now be described with reference to FIG. 17B to FIG. 17I. FIG. 17B to FIG. 17I are plan views illustrating the shapes of the first cavity portions of intermediate ground pattern conductors according to second to ninth modifications, respectively. Intermediate ground pattern conductor 240b to 240i illustrated in FIG. 17B to FIG. 17I, respectively, are also overlapped with the signal pattern line 30 in an area inside the virtual circle 241i in a plan view of the multilayer substrate 20, as in the embodiments described above. In a plan view of the multilayer substrate 20, the first end edge 241e has the first overlapping portion 241a overlapped with the signal pattern line 30. The respective modifications will be described below.

Figure 17B:
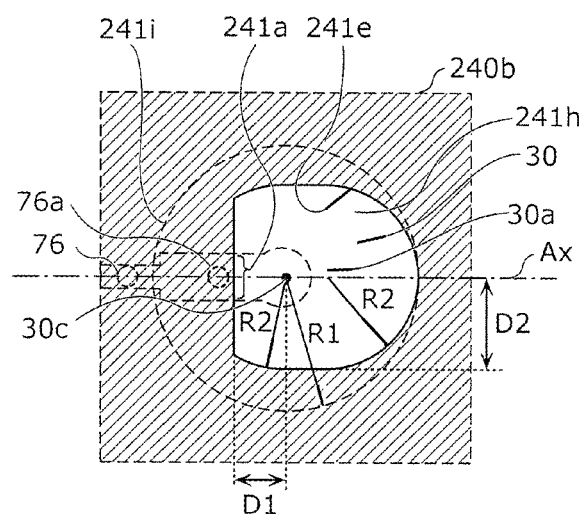
FIG. 17B is a plan view illustrating the shape of the first cavity portion of an intermediate ground pattern conductor according to a second modification.

As in the intermediate ground pattern conductor 240b according to the second modification illustrated in FIG. 17B, the first end edge 241e, which is the end edge of the first cavity portion 241h, may not be along the circular arc of the virtual circle 241i. In the intermediate ground pattern conductor 240b, the first end edge 241e has portions having shapes along the circular arc of a radius R2, which is smaller than a radius R1 of the virtual circle 241i. The radius R2 is greater than the distance D1 between the first overlapping portion 241a and the first connection point 30c.

More specifically, the first end edge 241e, which is the end edge of the first cavity portion 241h according to the second modification, may have multiple portions having shapes along the circular arc of the radius R2, linear portions with which the multiple portions are connected, and a portion having a linear shape including the first overlapping portion 241a. In the second modification, part of the circular arc of the radius R2 is inscribed in the virtual circle 241i.

Figure 17C:
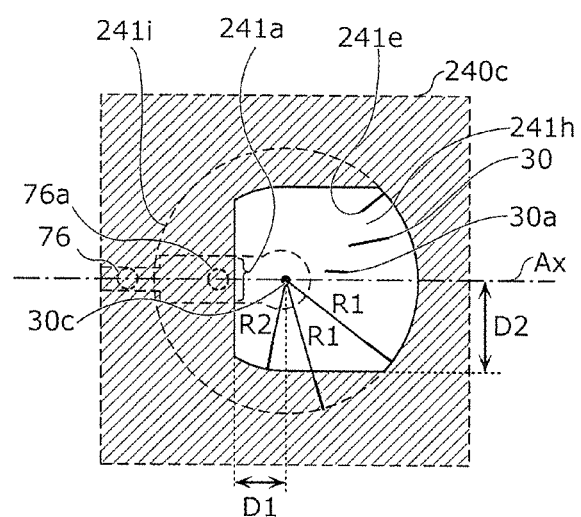
FIG. 17C is a plan view illustrating the shape of the first cavity portion of an intermediate ground pattern conductor according to a third modification.

As in the intermediate ground pattern conductor 240c according to the third modification illustrated in FIG. 17C, the first end edge 241e, which is the end edge of the first cavity portion 241h, may have a portion having a shape along the circular arc of the virtual circle 241i, portions having shapes along the circular arc of the radius R2 smaller than the radius R1 of the virtual circle 241i, linear portions with which the portions are connected, and a portion having a linear shape including the first overlapping portion 241a. The radius R2 is greater than the distance D1 between the first overlapping portion 241a and the first connection point 30c.

Figure 17D:
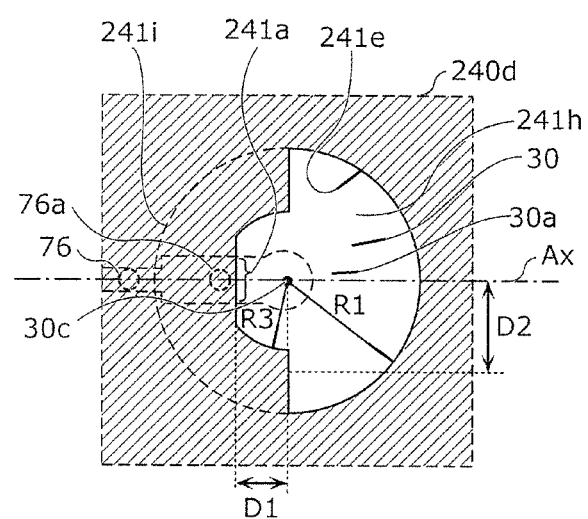
FIG. 17D is a plan view illustrating the shape of the first cavity portion of an intermediate ground pattern conductor according to a fourth modification.

As in the intermediate ground pattern conductor 240d according to the fourth modification illustrated in FIG. 17D, the first end edge 241e, which is the end edge of the first cavity portion 241h, may have a portion having a shape along an approximately half of the circular arc of the virtual circle 241i, linear portions along part of the chord of the circular arc, portions having shapes along the circular arc of a radius R3 smaller than the radius R1 of the virtual circle 241i, and a portion having a linear shape including the first overlapping portion 241a. The radius R3 is greater than the distance D1 between the first overlapping portion 241a and the first connection point 30c.

Figure 17E:
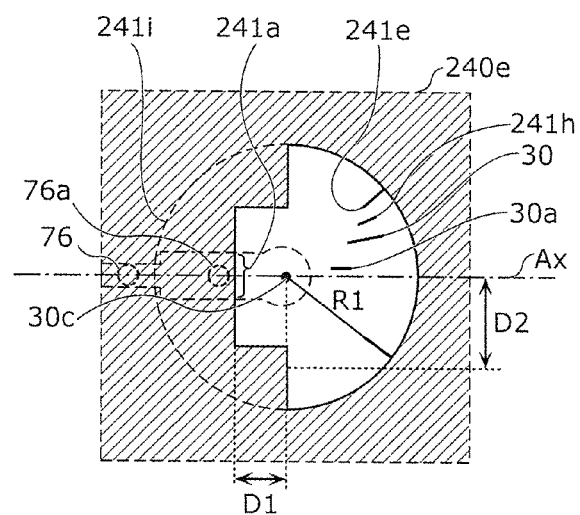
FIG. 17E is a plan view illustrating the shape of the first cavity portion of an intermediate ground pattern conductor according to a fifth modification.

As in the intermediate ground pattern conductor 240e according to the fifth modification illustrated in FIG. 17E, the first end edge 241e, which is the end edge of the first cavity portion 241h, may have a portion having a shape along an approximately half of the circular arc of the virtual circle 241i, linear portions along part of the chord of the circular arc, a portion having a linear shape including the first overlapping portion 241a, and linear portions with which the linear portions of the above two kinds are connected.

Figure 17F:
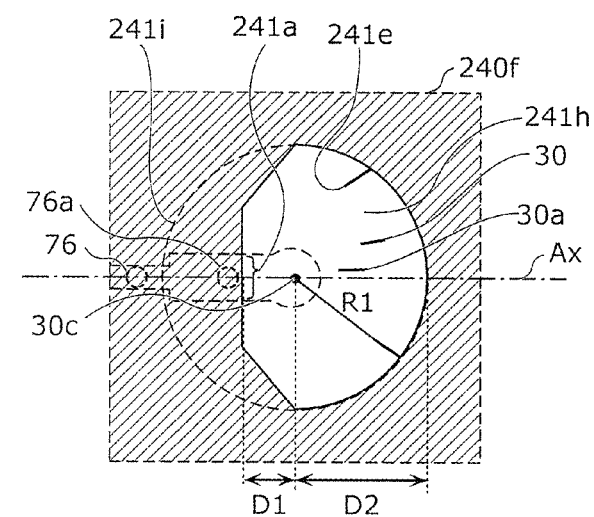
FIG. 17F is a plan view illustrating the shape of the first cavity portion of an intermediate ground pattern conductor according to a sixth modification.

As in the intermediate ground pattern conductor 240f according to the sixth modification illustrated in FIG. 17F, the first end edge 241e, which is the end edge of the first cavity portion 241h, may have a portion having a shape along an approximately half of the circular arc of the virtual circle 241i, a portion having a linear shape including the first overlapping portion 241a, and linear portions with which the two portions are connected.

Figure 17G:
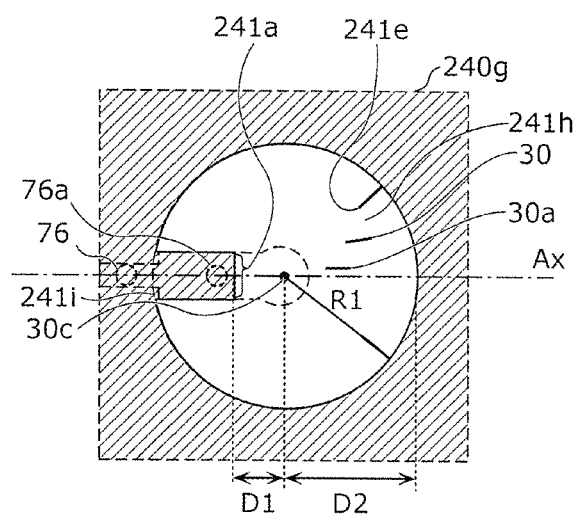
FIG. 17G is a plan view illustrating the shape of the first cavity portion of an intermediate ground pattern conductor according to a seventh modification.

As in the intermediate ground pattern conductor 240g according to the seventh modification illustrated in FIG. 17G, the first end edge 241e, which is the end edge of the first cavity portion 241h, may have the first overlapping portion 241a, a portion having a shape along the circular arc of the virtual circle 241i, and linear portions with which the portion is connected to the first overlapping portion 241a and which is along the central axis Ax.

Figure 17H:
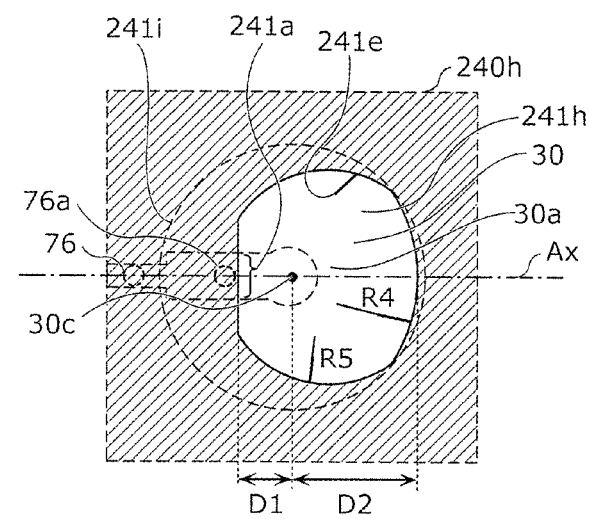
FIG. 17H is a plan view illustrating the shape of the first cavity portion of an intermediate ground pattern conductor according to an eighth modification.

As in the intermediate ground pattern conductor 240h according to the eighth modification illustrated in FIG. 17H, the first end edge 241e, which is the end edge of the first cavity portion 241h, may have a linear portion including the first overlapping portion 241a and portions having shapes along the circular arcs of a radius R4 and a radius R5 greater than the R1 of the virtual circle 241i.

Figure 17I:
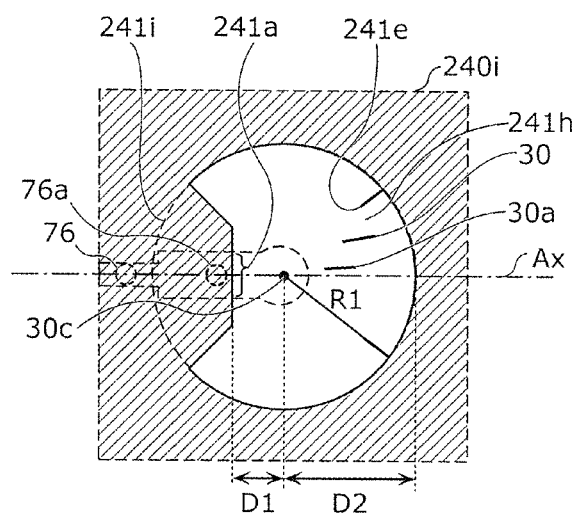
FIG. 17I is a plan view illustrating the shape of the first cavity portion of an intermediate ground pattern conductor according to a ninth modification.

As in the intermediate ground pattern conductor 240i according to the ninth modification illustrated in FIG. 17I, the first end edge 241e, which is the end edge of the first cavity portion 241h, may have a linear portion including the first overlapping portion 241a, a portion having a shape along the circular arc of the virtual circle 241i, and linear portions with which the portions are connected and which extend in the radius direction of the virtual circle 241i.

Also in the intermediate ground pattern conductors 240b to 240i according to the second modification to the ninth modification, respectively, described above, the distance D1 between the first overlapping portion 241a and the first connection point 30c is shorter than the distance D2 between any portion other than the first overlapping portion 241a of the first end edge 241e and the first connection point 30c.

Figure 17J:
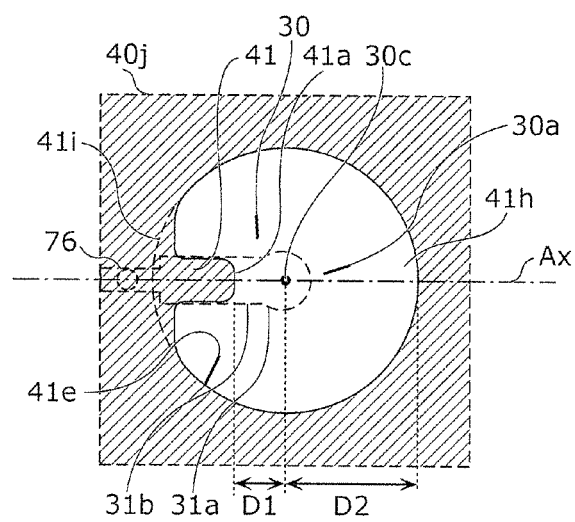
FIG. 17J is a plan view illustrating the shape of a first cavity portion of an intermediate ground pattern conductor according to a tenth modification.

The shape of each of the intermediate ground pattern conductors described above may be further modified. Such a modification will now be described with reference to FIG. 17J. FIG. 17J is a plan view illustrating the shape of the first cavity portion 41h of an intermediate ground pattern conductor 40j according to a tenth modification. As illustrated in FIG. 17J, corner portions of the first projecting portion 41 of the first cavity portion 41h and the like may be rounded. In other words, the radius of curvature of the corner portions of the first cavity portion 41h may be appropriately adjusted. Although an example of the modification is illustrated in FIG. 17J, each intermediate ground pattern conductor described above may be modified in the same manner.

Figure 17K:
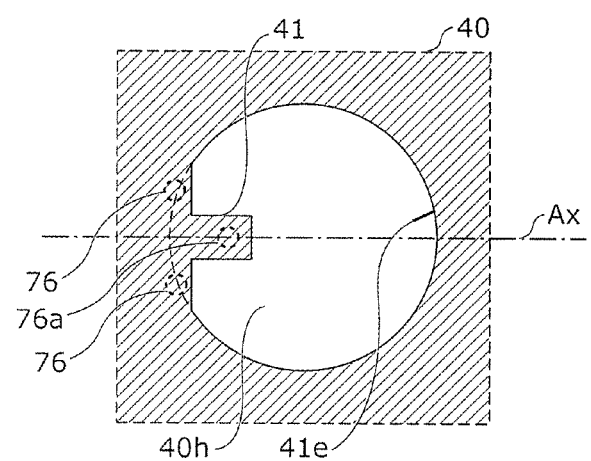
FIG. 17K is a plan view illustrating the arrangement of a ground via hole conductor according to an eleventh modification.
Figure 17L:
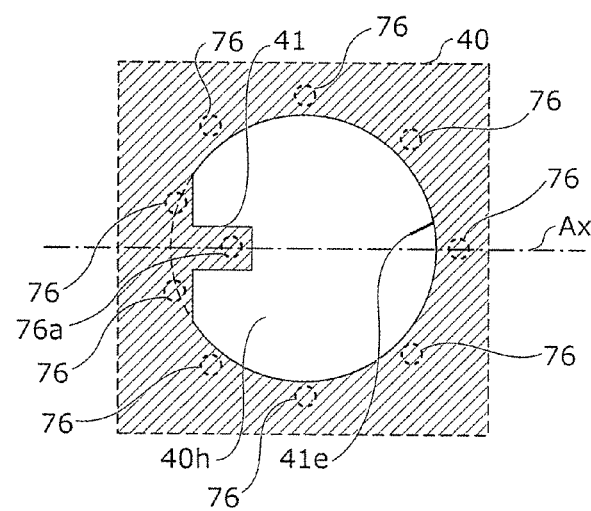
FIG. 17L is a plan view illustrating the arrangement of the ground via hole conductors according to a twelfth modification.

The arrangement and the number of the ground via hole conductors 76 are not limited to the examples described above. An example of how the ground via hole conductor 76 is arranged will now be described with reference to FIG. 17K and FIG. 17L. FIG. 17K and FIG. 17L are plan views illustrating the arrangement of the ground via hole conductor 76 according to an eleventh modification and the arrangement of the ground via hole conductors 76 according to a twelfth modification, respectively. Examples of the arrangement of the ground via hole conductor 76 connected to the intermediate ground pattern conductor 40 according to the first embodiment are illustrated in FIG. 17K and FIG. 17L.

As illustrated in FIG. 17K, the ground via hole conductor 76 may be arranged at a position apart from the central axis Ax near the first end edge 41e of the first cavity portion 41h or the multiple ground via hole conductors 76 may be arranged.

As illustrated in FIG. 17L, the multiple ground via hole conductors 76 may be arranged along the entire circumference of the first end edge 41e of the first cavity portion 41h at regular intervals or at irregular intervals.

Figure 19:
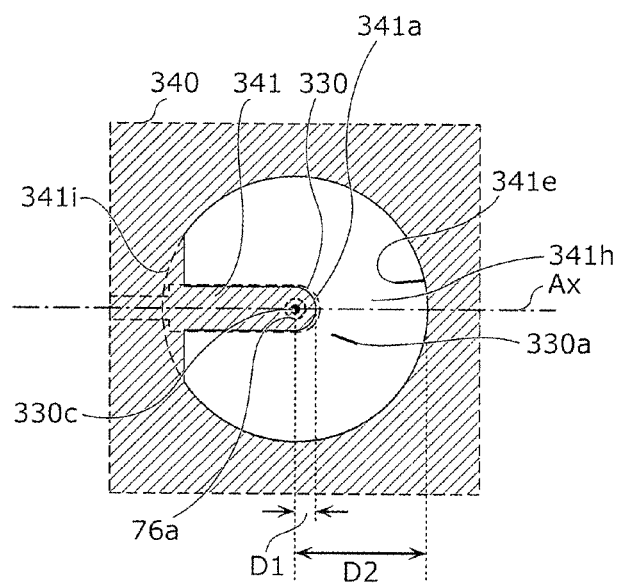
FIG. 19 is a plan view illustrating the relative position of the signal pattern line and the intermediate ground pattern conductor near the first end portion of the signal pattern line of the transmission line according to the thirteenth modification.

Although the strip line portion 31 of the signal pattern line 30 includes the wide width portion 31a and the narrow width portion 31b in the transmission line 12 according to the first embodiment, the configuration of the signal pattern line 30 is not limited to this. For example, the configuration of a signal pattern line 330 illustrated in FIG. 18 may be adopted, instead of the signal pattern line 30 according to the first embodiment and the second embodiment. FIG. 18 is a plan view illustrating the shapes of the ground pattern conductor 50, an intermediate ground pattern conductor 340, and the signal pattern line 330 near a first end portion 330a, which is one end portion of the transmission line according to a thirteenth modification. FIG. 19 is a plan view illustrating the relative position of the signal pattern line 330 and the intermediate ground pattern conductor 340 near the first end portion 330a of the signal pattern line 330 of the transmission line according to the thirteenth modification.

The signal pattern line 330 includes a strip line portion 331 and the coplanar line portion 32. The signal pattern line 330 has a first connection point 330c to which a signal conductor extending from the signal pattern line 330 in a direction away from the intermediate ground pattern conductor 340 in the laminating direction of the multilayer substrate 20 is connected. In a plan view of the multilayer substrate 20, a first cavity portion 341h having a first end edge 341e at least part of which is along a virtual circle 341i around the first connection point 330c is formed in the intermediate ground pattern conductor 340. The intermediate ground pattern conductor 340 has a first projecting portion 341 that projects toward the inside of the first cavity portion 341h along the signal pattern line 330 in a plan view of the multilayer substrate 20.

As illustrated in FIG. 18, the strip line portion 331 may have a uniform width. In this case, as illustrated in FIG. 18 and FIG. 19, the first projecting portion 341 of the intermediate ground pattern conductor 340 may be overlapped with the almost entire strip line portion 331 of the signal pattern line 330 in a plan view of the multilayer substrate 20. For example, the intermediate ground pattern conductor 340 may be overlapped with an area 80% or more and 95% or less of the area of the strip line portion 331. Also in the example illustrated in FIG. 19, as in the first embodiment, the first end edge 341e, which is the end edge of the first cavity portion 341h of the intermediate ground pattern conductor 340, has a first overlapping portion 341a overlapped with the signal pattern line 330 in a plan view of the multilayer substrate 20. The distance D1 between the first overlapping portion 341a and the first connection point 330c is shorter than the distance D2 between any portion other than the first overlapping portion 341a of the first end edge 341e and the first connection point 330c. The same advantages as in the transmission line 12 according to the first embodiment and the transmission line 12a according to the modification of the first embodiment are achieved also in the transmission line including the signal pattern line 330 and the intermediate ground pattern conductor 340 described above.

Figure 20:
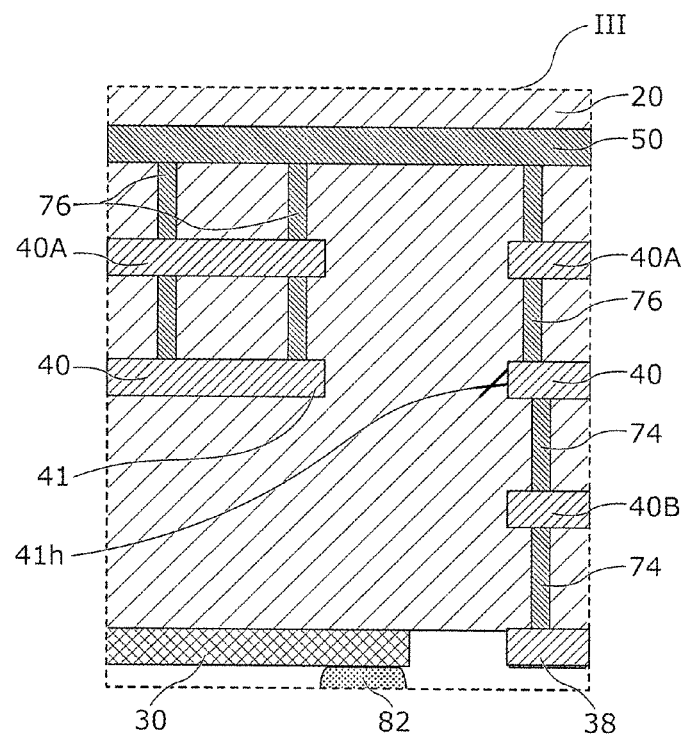
FIG. 20 is an enlarged cross-sectional view illustrating the configuration near the first end portion, which is one end portion of the signal pattern line of a transmission line according to a fourteenth modification.

Although one intermediate ground pattern conductor is provided between the ground pattern conductor 50 and the signal pattern line 30 in each intermediate ground pattern conductor described above, multiple intermediate ground pattern conductors may be provided between the ground pattern conductor 50 and the signal pattern line 30. Such an example will now be described with reference to FIG. 20. FIG. 20 is an enlarged cross-sectional view illustrating the configuration near the first end portion, which is one end portion of the signal pattern line 30 of a transmission line according to a fourteenth modification. As illustrated in FIG. 20, an intermediate ground pattern conductor 40A having a shape similar to that of the intermediate ground pattern conductor 40 may be further provided between the ground pattern conductor 50 and the intermediate ground pattern conductor 40. In addition, an intermediate ground pattern conductor 40B having a shape similar to that of the intermediate ground pattern conductor 40 may be provided between the intermediate ground pattern conductor 40 and the signal pattern line 30. The intermediate ground pattern conductor 40B may not have the first projecting portion 41. One of the intermediate ground pattern conductor 40A and the intermediate ground pattern conductor 40B may be provided. Multiple intermediate ground pattern conductors 40A may be provided between the ground pattern conductor 50 and the intermediate ground pattern conductor 40 and multiple intermediate ground pattern conductors 40B may be provided between the intermediate ground pattern conductor 40 and the signal pattern line 30.

Figure 21:
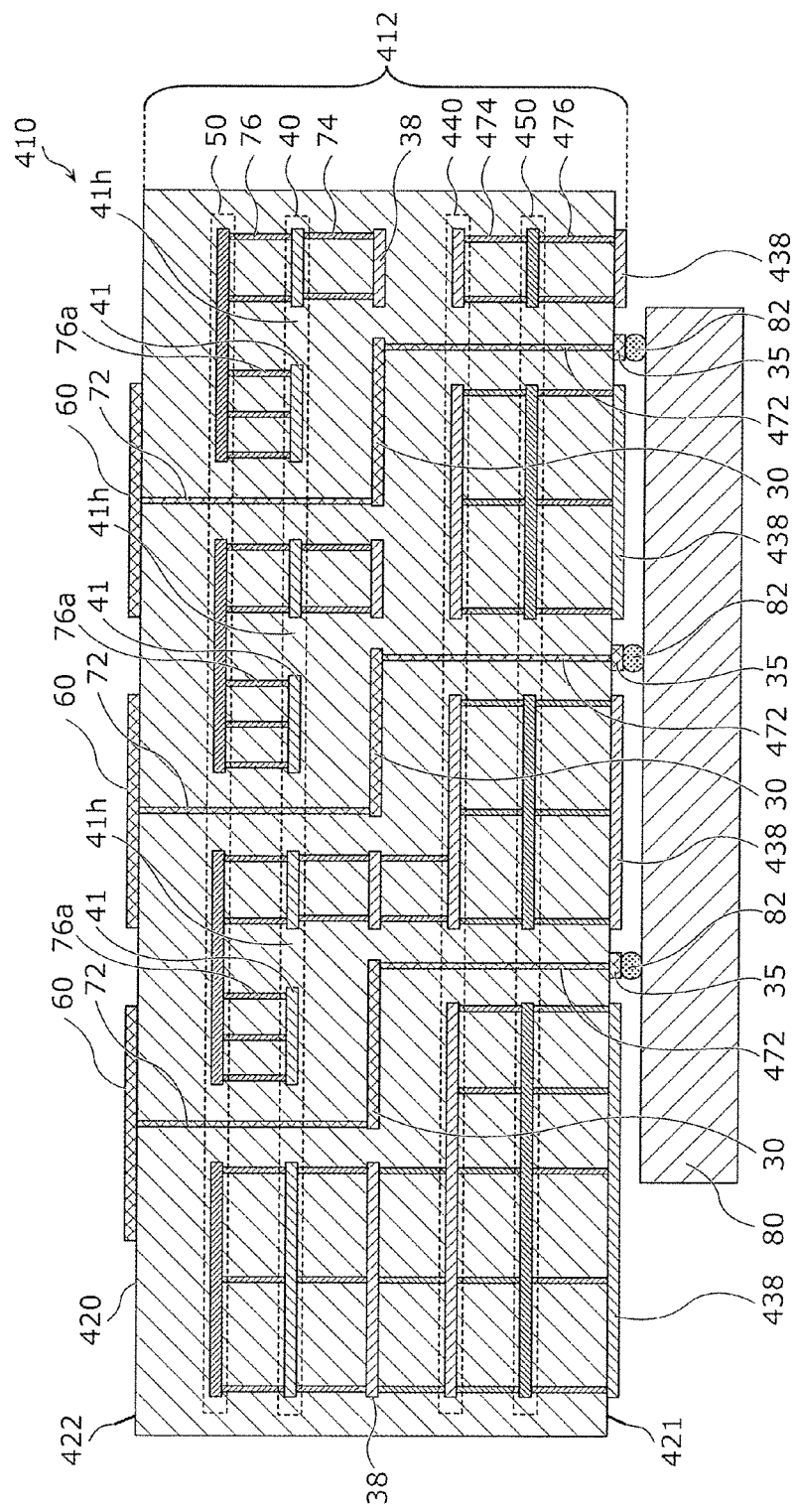
FIG. 21 is a cross-sectional view illustrating the basic configuration of a transmission line and an antenna module according to a fifteenth modification.

Although the signal pattern line 30 is arranged on the first main surface 21 of the multilayer substrate 20 in the transmission lines of the above embodiments, the arrangement configuration of the signal pattern line 30 is not limited to this. For example, the signal pattern line 30 may be arranged on an inner layer of the multilayer substrate. An example of such a configuration will now be described with reference to the drawing. FIG. 21 is a cross-sectional view illustrating the basic configuration of a transmission line 412 and an antenna module 410 according to a fifteenth modification. The cross-sectional view of the transmission line 412 and the antenna module 410 on the same cross section as that of the cross-sectional view illustrated in FIG. 2 is illustrated in FIG. 21.

As illustrated in FIG. 21, the antenna module 410 according to the present modification includes the transmission line 412, the multiple patch antennas 60 arranged in an array pattern, the solder bumps 82, and the integrated circuit 80. The transmission line 412 includes a multilayer substrate 420, the signal pattern lines 30, the signal via hole lines 72, the ground pattern conductor 50, the intermediate ground pattern conductor 40, the ground via hole conductors 74 and 76, the first ground via hole conductors 76a, and the signal-layer ground pattern conductor 38, as in the transmission line 12 according to the first embodiment. The transmission line 412 according to the present modification further includes signal via hole lines 472, an intermediate ground pattern conductor 440, a ground pattern conductor 450, a surface-layer ground pattern conductor 438, pad electrodes 35, and ground via hole conductors 474 and 476.

The multilayer substrate 420 is a substrate similar to the multilayer substrate 20 according to the first embodiment and the second embodiment and has a first main surface 421 and a second main surface 422.

The ground pattern conductor 450 is a pattern conductor that is arranged at a position different from that of the signal pattern line 30 in the laminating direction of the multilayer substrate 420 and that is overlapped with the signal pattern line 30 in a plan view of the multilayer substrate 420. The ground pattern conductor 450 is arranged at a position closer to the first main surface 421, compared with the signal pattern line 30, in the laminating direction of the multilayer substrate 420. The ground pattern conductor 450 is grounded to be kept at the ground potential.

The intermediate ground pattern conductor 440 is a pattern conductor that is arranged between the signal pattern line 30 and the ground pattern conductor 450 in the laminating direction of the multilayer substrate 420 and that is electrically connected to the ground pattern conductor 450. The intermediate ground pattern conductor 440 is electrically connected to the ground pattern conductor 450 via the ground via hole conductor 474.

The surface-layer ground pattern conductor 438 is a pattern conductor arranged on the first main surface 421 of the multilayer substrate 420. The surface-layer ground pattern conductor 438 is grounded to be kept at the ground potential. The surface-layer ground pattern conductor 438 is electrically connected to the ground pattern conductor 450 via the ground via hole conductor 476.

Each signal via hole line 472 is a signal conductor that extends from the signal pattern line 30 in a direction away from the intermediate ground pattern conductor 40 in the laminating direction of the multilayer substrate 420. The signal via hole line 472 is connected to the signal pattern line 30 at a first connection point not illustrated in FIG. 21. The signal via hole line 472 passes through the intermediate ground pattern conductor 440 and the ground pattern conductor 450 in cavity portions formed in the intermediate ground pattern conductor 440 and the ground pattern conductor 450. The signal via hole line 472 is connected to the corresponding pad electrode 35.

Each pad electrode 35 is an electrode arranged on the first main surface 421. The pad electrode 35 is connected to a terminal of the integrated circuit 80 via the corresponding solder bump 82.

As described above, also in the case in which the signal pattern lines 30 are arranged on an inner layer of the multilayer substrate 420, the same advantages as in the first embodiment are achieved. The configuration according to the second embodiment may be applied to the present modification.

Figure 22:
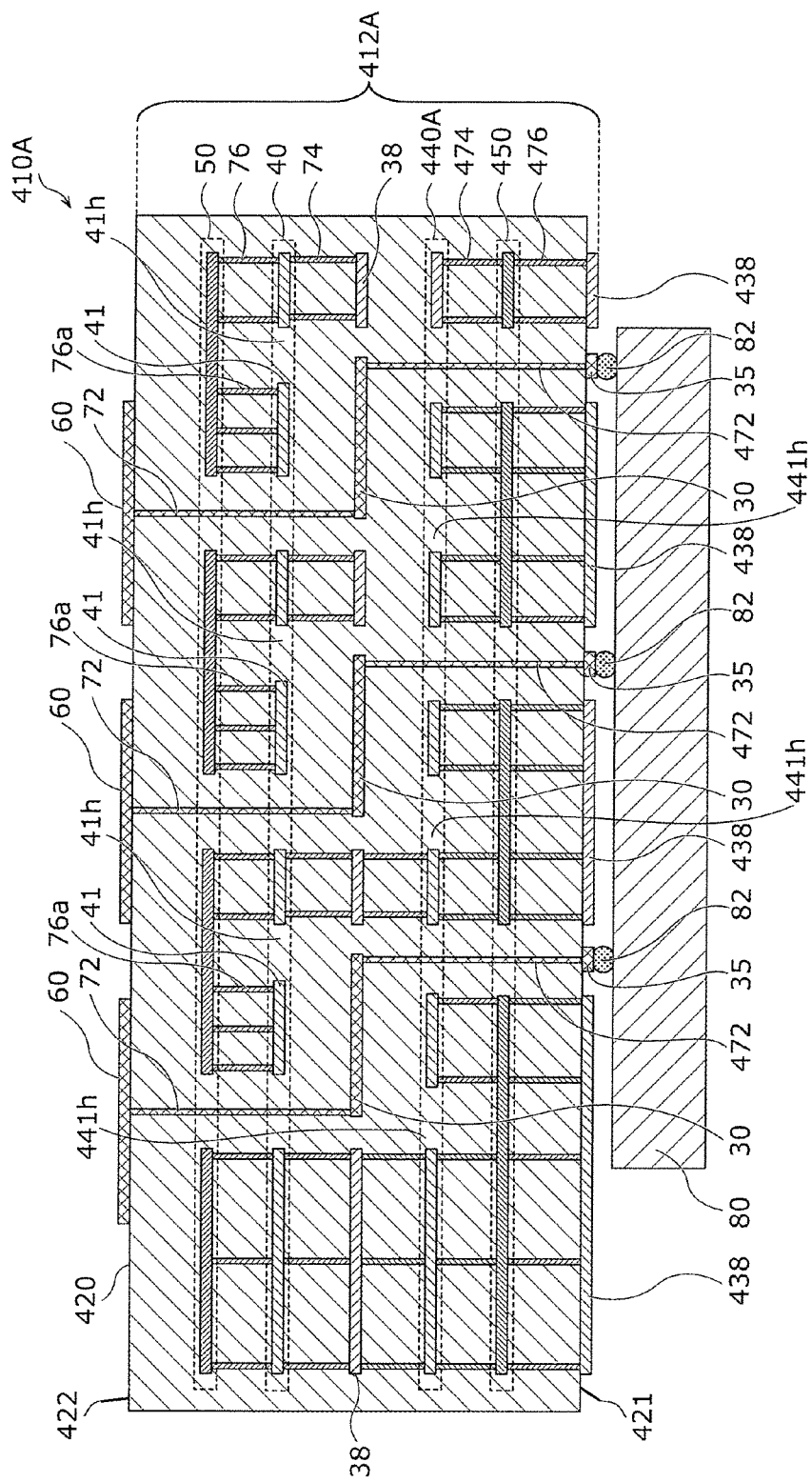
FIG. 22 is a cross-sectional view illustrating the basic configuration of a transmission line and an antenna module according to a sixteenth modification.

The transmission line 412 and the antenna module 410 according to the fifteenth modification described above may be further modified. Such transmission line and antenna module will now be described with reference to FIG. 22. FIG. 22 is a cross-sectional view illustrating the basic configuration of a transmission line 412A and an antenna module 410A according to a sixteenth modification. The cross-sectional view of the transmission line 412A and the antenna module 410A on the same cross section as that of the cross-sectional view illustrated in FIG. 2 is illustrated in FIG. 22.

The transmission line 412A and the antenna module 410A according to the sixteenth modification differs from the transmission line 412 and the antenna module 410 according to the fifteenth modification in the configuration of an intermediate ground pattern conductor 440A.

In the sixteenth modification, the intermediate ground pattern conductor 40 and the intermediate ground pattern conductor 440A are also referred to as a first intermediate ground pattern conductor and a second intermediate ground pattern conductor, respectively, to discriminate between the intermediate ground pattern conductor 40 and the intermediate ground pattern conductor 440A.

The intermediate ground pattern conductor 440A (the second intermediate ground pattern conductor) according to the sixteenth modification is a pattern conductor that is arranged at a position different from that of the signal pattern line 30 in the laminating direction of the multilayer substrate 420 and that is overlapped with the signal pattern line in a plan view of the multilayer substrate 420, as in the intermediate ground pattern conductor 440 according to the fifteenth modification. In the laminating direction of the multilayer substrate 420, the intermediate ground pattern conductor 40 (the first intermediate ground pattern conductor), the signal pattern line 30, and the intermediate ground pattern conductor 440A (the second intermediate ground pattern conductor) are arranged in this order. The intermediate ground pattern conductor 440A is arranged between the signal pattern line 30 and the ground pattern conductor 450 in the laminating direction of the multilayer substrate 420 and is electrically connected to the ground pattern conductor 450.

Each signal via hole line 472 is connected to the signal pattern line 30 at a first connection point not illustrated in FIG. 22.

The signal pattern line 30 has a first connection point and a second connection point (not illustrated in FIG. 22) to which the signal via hole line 472 and the signal via hole line 72 are connected, respectively, as in the embodiments described above illustrated in FIG. 4 and FIG. 15. In addition, as in the embodiments described above illustrated in FIG. 4 and FIG. 15, the first connection point is arranged in the first end portion, which is one end portion of the signal pattern line 30 (refer to FIG. 4), and the second connection point is arranged in the second end portion, which is the other end portion of the signal pattern line 30 (refer to FIG. 15).

In the sixteenth modification, the first cavity portion 41h opening at a position overlapped with the first end portion, which is one end portion of the signal pattern line 30, in a plan view of the multilayer substrate 420 is formed in the intermediate ground pattern conductor 40 (refer to, for example, FIG. 5A). In addition, a third cavity portion 441h, which a cavity portion opening at a position overlapped with the second end portion, which is the other end portion, in a plan view of the multilayer substrate 420 is formed in the intermediate ground pattern conductor 440A.

Each signal via hole line 72 is connected to the corresponding patch antenna 60 via no line extending in the laminating direction. Each signal via hole line 472 is connected to the integrated circuit 80 via no line extending in the laminating direction. The signal via hole line 72 passes through the intermediate ground pattern conductor 40 at a position different from the first cavity portion 41h.

Forming the first cavity portion 41h in the intermediate ground pattern conductor 40 in the above manner enables the impedance mismatching near the first connection point of the signal via hole line 472 to be reduced. In addition, forming the third cavity portion 441h in the intermediate ground pattern conductor 440A enables the impedance mismatching near the second connection point of the signal via hole line 72 to be reduced. The shape of the third cavity portion 441h is not especially limited. For example, the shape of the third cavity portion 441h may be the same as that of the first cavity portion 41h. Specifically, in a plan view of the multilayer substrate 420, the first end edge, which is the end edge of the third cavity portion 441h, may have the first overlapping portion overlapped with the signal pattern line 30 and the distance between the first overlapping portion and the second connection point may be shorter than the distance between any portion other than the first overlapping portion of the first end edge and the second connection point. Adopting such shape enables the impedance mismatching near the second connection point to be further reduced.

Although both the first cavity portion 41h and the third cavity portion 441h are formed in the example illustrated in FIG. 22, at least one of the cavity portions may be formed. Also in such a configuration, the impedance mismatching in the transmission line 412A and the antenna module 410A is capable of being reduced.

Although the antenna module 410A includes the patch antennas 60 and the integrated circuit 80, it is sufficient for the antenna module 410A to include the patch antennas 60 or the integrated circuit 80. In other words, it is sufficient for the antenna module 410A to include the transmission line 412A and at least one of the patch antennas 60 and the integrated circuit 80, which are connected to the transmission line 412A.

When the antenna module 410A includes only the patch antennas 60, among the patch antennas 60 and the integrated circuit 80, the transmission line 412A may not include the intermediate ground pattern conductor 440A and the ground pattern conductor 450. When the antenna module 410A includes only the integrated circuit 80, among the patch antennas 60 and the integrated circuit 80, the transmission line 412A may not include the intermediate ground pattern conductor 40 and the ground pattern conductor 50.

As described above, the transmission line 412A includes the multilayer substrate 420 formed of a dielectric body; the signal pattern line 30 arranged in the multilayer substrate 420, the ground pattern conductor that is arranged at a position different from that of the signal pattern line 30 in the laminating direction of the multilayer substrate 420 and that is overlapped with the signal pattern line 30 in a plan view of the multilayer substrate 420; the intermediate ground pattern conductor that is arranged between the signal pattern line 30 and the ground pattern conductor in the laminating direction of the multilayer substrate 420 and that is electrically connected to the ground pattern conductor; and the signal via hole line that is connected to one end portion of the signal pattern line 30 and that extends from the signal pattern line 30 in a direction away from the intermediate ground pattern conductor in the laminating direction of the multilayer substrate 420. A cavity portion opening at a position overlapped with one end portion in a plan view of the multilayer substrate 420 is formed in the intermediate ground pattern conductor. The signal via hole line is connected to the patch antenna or the integrated circuit via no line extending in the laminating direction.

Forming the cavity portion in the intermediate ground pattern conductor in the above manner enables the impedance mismatching near the connection point between the signal pattern line 30 and the signal via hole line to be reduced. Accordingly, it is possible to reduce the impedance mismatching in the transmission line 412A and the antenna module 410A.

Although the signal via hole line 72 connected to the signal pattern line 30 is directly connected to the corresponding patch antenna 60 in the antenna module 410 according to the sixteenth modification, the signal via hole line 72 may be connected to the patch antenna 60 via another line. Such an antenna module will now be described with reference to FIG. 23, and FIGS. 24A to 24D.

Figure 23:
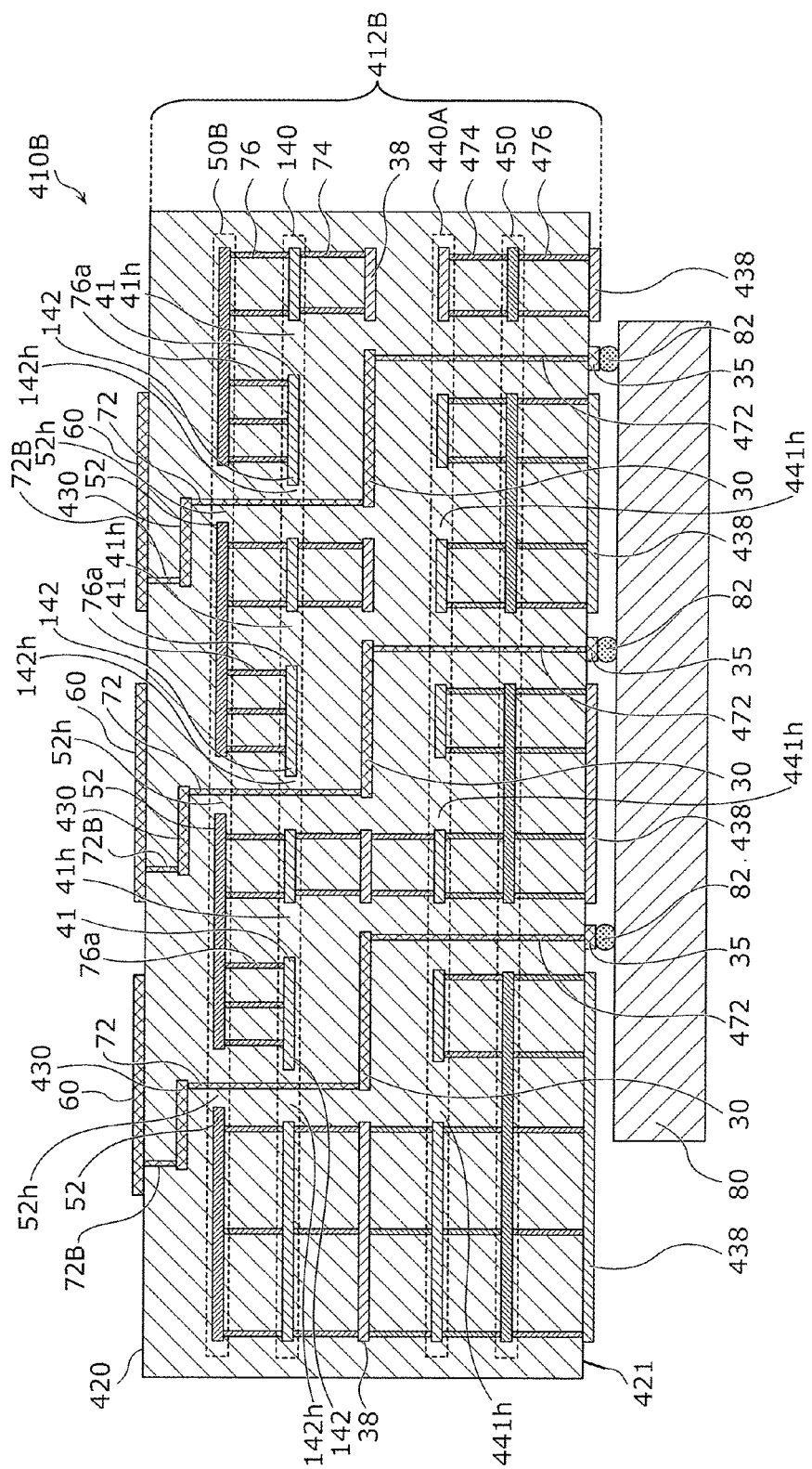
FIG. 23 is a cross-sectional view illustrating the basic configuration of a transmission line and an antenna module according to a seventeenth modification.

FIG. 23 is a cross-sectional view illustrating the basic configuration of a transmission line 412B and an antenna module 410B according to a seventeenth modification. Each of FIGS. 24A, 24B, 24C and 24D is a plan view illustrating the shapes of a junction pattern line 430, a ground pattern conductor 50B, the intermediate ground pattern conductor 140, and the signal pattern line 30 near the second end portion of the signal pattern line 30 of the transmission line 412B according to the seventeenth modification.

As illustrated in FIG. 23, the transmission line 412B and the antenna module 410B according to the seventeenth modification differ from the transmission line 412A and the antenna module 410A according to the sixteenth modification in the configuration between the signal via hole line 72 and the patch antenna 60. The signal via hole line 72 according to the seventeenth modification is connected to the corresponding patch antenna 60 via the junction pattern line 430 and a signal via hole line 72B.

Each junction pattern line 430 is a pattern conductor arranged between the ground pattern conductor 50B and the corresponding patch antenna 60 in the laminating direction of the multilayer substrate 420. The junction pattern line 430 is a film conductor formed on a plane parallel to the first main surface 421 and the second main surface 422 of the multilayer substrate 420. As illustrated in a plan view in FIG. 24A, the junction pattern line 430 is connected to the signal via hole line 72 at a third connection point 430c of a third end portion 430a, which is one end portion. As illustrated in FIG. 23, the junction pattern line 430 is connected to the signal via hole line 72B at the other end portion. The planar shape of the junction pattern line 430 is not especially limited. The junction pattern line 430 may have a planar shape similar to that of the signal pattern line 30, as illustrated in FIGS. 24A, 24B, 24C and 24D.

The signal via hole line 72B is a via hole conductor that is connected to the junction pattern line 430 and that extends in the laminating direction of the multilayer substrate 420. The signal via hole line 72B is connected to the corresponding patch antenna 60.

The transmission line 412B according to the seventeenth modification differs from the transmission line 412A according to the sixteenth modification also in the configuration of the ground pattern conductor 50B.

Figure 24:
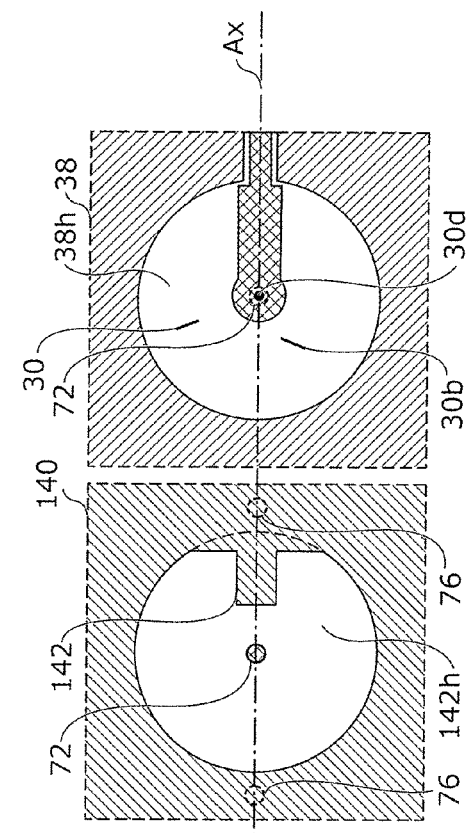

A cavity portion 52h is formed in the ground pattern conductor 50B at a position overlapped with the third end portion 430a of the junction pattern line 430 in a plan view of the multilayer substrate 420, as illustrated in a plan view in FIG. 24B. The signal via hole line 72 is arranged in the cavity portion 52h. In other words, the signal via hole line 72 passes through the ground pattern conductor 50B in the cavity portion 52h. The ground pattern conductor 50B has a projecting portion 52 that projects toward the inside of the cavity portion 52h along the junction pattern line 430 in a plan view of the multilayer substrate 420. The configuration of the cavity portion 52h of the ground pattern conductor 50B is not limited to the configuration described above and it is sufficient for the cavity portion 52h of the ground pattern conductor 50B to have a configuration in which the cavity portion 52h opens at a position overlapped with the third end portion 430a of the junction pattern line 430 in a plan view of the multilayer substrate 420.

The intermediate ground pattern conductor 140 according to the seventeenth modification has a configuration similar to that of the intermediate ground pattern conductor 140 according to the second embodiment, as illustrated in a plan view in FIG. 24C.

The signal pattern line 30 according to the seventeenth modification has a configuration similar to that of the signal pattern line 30 according to the first embodiment, as illustrated in a plan view in FIG. 24D.

Also, in the transmission line 412B and the antenna module 410B having the above configuration, the same advantages as in the transmission line 412A and the antenna module 410A according to the sixteenth modification are achieved. In addition, since the cavity portion 52h of the ground pattern conductor 50B and the second cavity portion 142h of the intermediate ground pattern conductor 140 have the projecting portion 52 and the second projecting portion 142, respectively, in the seventeenth modification, the impedance mismatching near the end portions of the signal pattern line 30 and the junction pattern line 430 are capable of being further reduced.

The shapes of the cavity portion 52h and the second cavity portion 142h according to the seventeenth modification may be modified in the same manner as in the first cavity portions according to the first to tenth modifications.

A cavity portion having a shape similar to that of the cavity portion 52h may be formed in the ground pattern conductor 50B at a position overlapped with the other end portion (that is, the end portion connected to the signal via hole line 72B) of the junction pattern line 430 in a plan view of the multilayer substrate 420. This enables the impedance mismatching near the other end portion of the junction pattern line 430 to be reduced.

Although the configuration to reduce the impedance mismatching in the transmission line connected to the integrated circuit or the like is described in each embodiment and each modification described above, the above configurations may be used in the integrated circuit when the integrated circuit includes the transmission line. An example of such an antenna module will now be described with reference to FIG. 25.

FIG. 25 is a cross-sectional view illustrating the basic configuration of an antenna module 410C according to an eighteenth modification.

As illustrated in FIG. 25, the antenna module 410C includes the transmission line 412A according to the sixteenth modification, the multiple patch antennas 60, an integrated circuit 80C including multiple terminals 535 connected to the respective multiple signal via hole lines 472 of the transmission line 412A. The antenna module 410C according to the eighteenth modification differs from the antenna module 410A according to the sixteenth modification in the configuration of the integrated circuit 80C.

The integrated circuit 80C according to the eighteenth modification includes the multiple terminals 535, a surface-layer ground pattern conductor 538, multiple ground via hole conductors 574, an inner-layer ground pattern conductor 540, multiple signal via hole lines 572, and multiple signal pattern lines 530. The dielectric body is arranged in the area other than the respective conductors and lines of the integrated circuit 80C. The portion where the respective conductors and lines of the integrated circuit 80C are arranged may be the dielectric substrate similar to the multilayer substrate 420. The integrated circuit 80C further includes devices composing the circuit and so on although not illustrated in FIG. 25.

Each terminal 535 is arranged on the surface of the integrated circuit 80C, which is opposed to the first main surface 421 of the transmission line 412A, and is connected to the corresponding signal via hole line 472. The terminal 535 is connected to the corresponding pad electrode 35 via the corresponding solder bump 82. The surface of the integrated circuit 80C, which is opposed to the first main surface 421 of the transmission line 412A, is hereinafter also referred to as a mounting surface.

Each signal pattern line 530 is a pattern conductor arranged on an inner layer of the integrated circuit 80C. The signal pattern line 530 is a film conductor formed on a plane parallel to the mounting surface of the integrated circuit 80C. One end portion of the signal pattern line 530 is connected to the corresponding signal via hole line 572 and the other end portion thereof is connected to a device composing the circuit or the like in the integrated circuit 80C.

The surface-layer ground pattern conductor 538 is a pattern conductor arranged on the mounting surface of the integrated circuit 80C. The surface-layer ground pattern conductor 538 is grounded to be kept at the ground potential. In the eighteenth modification, the surface-layer ground pattern conductor 538 is connected to the surface-layer ground pattern conductor 438 of the transmission line 412A via the solder bumps 82. The surface-layer ground pattern conductor 538 is arranged so as not to be in contact with the multiple terminals 535. In the eighteenth modification, cavity portions 539h are formed in the surface-layer ground pattern conductor 538 at positions overlapped with one end portions of the corresponding signal pattern lines 530 (excluding the position overlapped with one end portion of the rightmost signal pattern line 530 in FIG. 25) in a plan view of the mounting surface of the integrated circuit 80C. The surface-layer ground pattern conductor 538 has projecting portions 539 that project toward the inside of the cavity portions 539h along the signal pattern lines 530 in a plan view of the mounting surface of the integrated circuit 80C. This enables the impedance mismatching near one end portions of the signal pattern lines 530 to be reduced. It is sufficient for the cavity portion 539h of the surface-layer ground pattern conductor 538 to open at a position overlapped with one end portion of the signal pattern line 530 in a plan view of the mounting surface of the integrated circuit 80C, and the configuration of the cavity portion 539h of the surface-layer ground pattern conductor 538 is not limited to the one described above. For example, the cavity portion 539h of the surface-layer ground pattern conductor 538 may have a configuration similar to that of the cavity portion according to each modification described above.

Each signal via hole line 572 is a via hole conductor that is connected to the corresponding terminal 535 and that extends in a direction vertical to the mounting surface of the integrated circuit 80C. The signal via hole line 572 is connected to the corresponding signal pattern line 530.

The inner-layer ground pattern conductor 540 is a pattern conductor arranged at a position apart from the mounting surface, compared with the signal pattern lines 530, in the direction vertical to the mounting surface of the integrated circuit 80C. The inner-layer ground pattern conductor 540 is electrically connected to the surface-layer ground pattern conductor 538 via the ground via hole conductors 574.

Cavity portions 541h are formed in the inner-layer ground pattern conductor 540 at positions overlapped with one end portions of the corresponding signal pattern lines 530 (excluding the position overlapped with one end portion of the rightmost signal pattern line 530 in FIG. 25) in a plan view of the mounting surface of the integrated circuit 80C. The conductor electrically connected to the signal pattern line 530 (for example, the signal via hole line 572) is not arranged in each cavity portion 541h. Such cavity portions 541h enables the impedance mismatching near one end portions of the corresponding signal pattern lines 530 to be reduced. The inner-layer ground pattern conductor 540 has projecting portions 541 that project toward the inside of the cavity portions 541h along the signal pattern lines 530 in a plan view of the mounting surface of the integrated circuit 80C. This enables the impedance mismatching near one end portions of the signal pattern lines 530 to be further reduced. It is sufficient for the cavity portion 541h of the inner-layer ground pattern conductor 540 to open at a position overlapped with one end portion of the signal pattern line 530 in a plan view of the mounting surface of the integrated circuit 80C, and the configuration of the cavity portion 541h of the inner-layer ground pattern conductor 540 is not limited to the one described above. For example, the cavity portion 541h of the inner-layer ground pattern conductor 540 may have a configuration similar to that of the cavity portion according to each modification described above. The cavity portions 541h may not necessarily be formed in the inner-layer ground pattern conductor 540.

Each ground via hole conductor 574 is a via hole conductor that is connected to the surface-layer ground pattern conductor 538 and that extends in the direction vertical to the mounting surface of the integrated circuit 80C. The ground via hole conductor 574 is connected to the inner-layer ground pattern conductor 540.

With the antenna module 410C having the above configuration, it is possible to reduce the impedance mismatching in the signal pattern lines 530.

Although the configuration to reduce the impedance mismatching in the signal pattern lines 530 arranged on an inner layer of the integrated circuit 80C is indicated in the eighteenth modification, the impedance mismatching is capable of being reduced when the integrated circuit has the signal pattern lines on a surface layer. An example of such an antenna module will now be described with reference to FIG. 26.

FIG. 26 is a cross-sectional view illustrating the basic configuration of an antenna module 410D according to a nineteenth modification.

As illustrated in FIG. 26, the antenna module 410D includes a transmission line 412D, the multiple patch antennas 60, an integrated circuit 80D including multiple signal pattern lines 535D connected to the respective multiple signal via hole lines 472 of the transmission line 412D. The integrated circuit 80D further includes devices composing the circuit and so on although not illustrated in FIG. 26.

The integrated circuit 80D according to the nineteenth modification includes the multiple signal pattern lines 535D, the surface-layer ground pattern conductor 538, the multiple ground via hole conductors 574, and the inner-layer ground pattern conductor 540. The dielectric body is arranged in the area other than the respective conductors and lines of the integrated circuit 80D. The portion where the respective conductors and lines of the integrated circuit 80D are arranged may be the dielectric substrate similar to the multilayer substrate 420.

Each signal pattern line 535D is arranged on the surface of the integrated circuit 80D, which is opposed to the first main surface 421 of the transmission line 412D, and is connected to the corresponding pad electrode 35 of the transmission line 412D via the corresponding solder bump 82 at one end portion. The surface of the integrated circuit 80D, which is opposed to the first main surface 421 of the transmission line 412D, is hereinafter also referred to as the mounting surface. The other end portion of the signal pattern line 535D is connected to a device composing the circuit or the like in the integrated circuit 80D.

The surface-layer ground pattern conductor 538 is a pattern conductor arranged on the mounting surface of the integrated circuit 80D. The surface-layer ground pattern conductor 538 is grounded to be kept at the ground potential. In the nineteenth modification, the surface-layer ground pattern conductor 538 is connected to a surface-layer ground pattern conductor 438D of the transmission line 412D via the solder bumps 82. The surface-layer ground pattern conductor 538 is arranged so as not to be in contact with the multiple signal pattern lines 535D.

Each ground via hole conductor 574 is a via hole conductor that is connected to the surface-layer ground pattern conductor 538 and that extends in the direction vertical to the mounting surface of the integrated circuit 80D. The ground via hole conductor 574 is connected to the inner-layer ground pattern conductor 540.

The inner-layer ground pattern conductor 540 is a pattern conductor arranged at a position apart from the mounting surface, compared with the signal pattern line 535D, in the direction vertical to the mounting surface of the integrated circuit 80D. The inner-layer ground pattern conductor 540 is electrically connected to the surface-layer ground pattern conductor 538 via the ground via hole conductors 574.

The cavity portions 541h are formed in the inner-layer ground pattern conductor 540 at positions overlapped with one end portions of the signal pattern lines 535D (excluding the position overlapped with one end portion of the rightmost signal pattern line 535D in FIG. 26) in a plan view of the mounting surface of the integrated circuit 80D. The conductor electrically connected to the signal pattern line 535D is not arranged in each cavity portion 541h. Such cavity portions 541h enables the impedance mismatching near one end portions of the corresponding signal pattern lines 535D to be reduced. The inner-layer ground pattern conductor 540 has the projecting portions 541 that project toward the inside of the cavity portions 541h along the signal pattern lines 535D in a plan view of the mounting surface of the integrated circuit 80D. This enables the impedance mismatching near one end portions of the signal pattern lines 535D to be further reduced. It is sufficient for the cavity portion 541h of the inner-layer ground pattern conductor 540 to open at a position overlapped with one end portion of the signal pattern line 535D in a plan view of the mounting surface of the integrated circuit 80D, and the configuration of the cavity portion 541h of the inner-layer ground pattern conductor 540 is not limited to the one described above. For example, the cavity portion 541h of the inner-layer ground pattern conductor 540 may have a configuration similar to that of the cavity portion according to each modification described above. The cavity portions 541h may not necessarily be formed in the inner-layer ground pattern conductor 540.

The transmission line 412D differs from the transmission line 412A according to the sixteenth modification in the configuration of the surface-layer ground pattern conductor 438D and is equivalent to the transmission line 412A according to the sixteenth modification in the remaining points.

Cavity portion 439h are formed in the surface-layer ground pattern conductor 438D at positions overlapped with one end portions of the signal pattern lines 535D in a plan view of the multilayer substrate 420. This enables the impedance mismatching near one end portions of the signal pattern lines 535D to be reduced. In addition, the surface-layer ground pattern conductor 438D has projecting portions 439 that extend toward the inside of the cavity portions 439h along the signal pattern lines 535D in a plan view of the multilayer substrate 420. This enables the impedance mismatching near one end portions of the signal pattern lines 535D to be further reduced. It is sufficient for the cavity portion 439h of the surface-layer ground pattern conductor 438D to open at a position overlapped with one end portion of the signal pattern line 535D in a plan view of the multilayer substrate 420, and the configuration of the cavity portion 439h of the surface-layer ground pattern conductor 438D is not limited to the one described above. For example, the cavity portion 439h of the surface-layer ground pattern conductor 438D may have a configuration similar to that of the cavity portion according to each modification described above.

With the antenna module 410D having the above configuration, it is possible to reduce the impedance mismatching in the signal pattern lines 535D, as described above.

The present disclosure is widely usable for a communication device, such as a mobile phone, as an antenna apparatus and a communication apparatus capable of reducing transmission loss of radio-frequency signals.

10, 10a, 110, 410, 410A, 410B, 410C, 410D antenna module
12, 12a, 112, 412, 412A, 412B, 412D transmission line
20, 420 multilayer substrate
21, 421 first main surface
22, 422 second main surface
30, 330, 530, 535D signal pattern line
30a, 330a first end portion
30b second end portion
30c, 330c first connection point
30d second connection point
31, 331 strip line portion
31a wide width portion
31b narrow width portion
32 coplanar line portion
35 pad electrode
38 signal-layer ground pattern conductor
38h, 50h, 52h, 150h, 439h, 539h, 541h cavity portion
38s slit portion
40, 40A, 40j, 140, 240a, 240b, 240c, 240d, 240e, 240f, 240g, 240h, 240i, 340, 440, 440A intermediate ground pattern conductor
41, 341 first projecting portion
41a, 241a, 341a first overlapping portion
41e, 241e, 341e first end edge
41h, 241h, 341h first cavity portion
41i, 142i, 150i, 241i, 341i virtual circle
42h, 142h second cavity portion
50, 50B, 150, 450 ground pattern conductor
52, 151, 439, 539, 541 projecting portion
60 patch antenna
72, 72B, 472, 572 signal via hole line 74, 76, 474, 476, 574 ground via hole conductor
76a first ground via hole conductor
76b second ground via hole conductor
80, 80C, 80D integrated circuit
82 solder bump
142 second projecting portion
142a second overlapping portion
142e second end edge
150e end edge
430 junction pattern line
430a third end portion
430c third connection point
438, 438D, 538 surface-layer ground pattern conductor
535 terminal
540 inner-layer ground pattern conductor

The invention claimed is:

1. A transmission line comprising:
a multilayer substrate comprised of a dielectric body;
a signal pattern line arranged on the multilayer substrate;
a ground pattern conductor arranged at a position different from a position of the signal pattern line in a laminating direction of the multilayer substrate and overlapped with the signal pattern line in a plan view of the multilayer substrate; and
an intermediate ground pattern conductor arranged between the signal pattern line and the ground pattern conductor in the laminating direction of the multilayer substrate and electrically connected to the ground pattern conductor,
wherein the signal pattern line has a first connection point to which a signal conductor is connected, the signal conductor extending from the signal pattern line in a direction away from the intermediate ground pattern conductor in the laminating direction of the multilayer substrate,
wherein the first connection point is arranged in a first end portion being one end portion of the signal pattern line,
wherein a first cavity portion opening at a position overlapped with the first end portion of the signal pattern line in a plan view of the multilayer substrate is provided in the intermediate ground pattern conductor, and
wherein, in a plan view of the multilayer substrate, a first end edge being an end edge of the first cavity portion has a first overlapping portion overlapped with the signal pattern line, and wherein a distance between the first overlapping portion and the first connection point is shorter than a distance between any portion other than the first overlapping portion of the first end edge and the first connection point.

2. The transmission line according to claim 1,
wherein the intermediate ground pattern conductor has a first projecting portion projecting toward an inside of the first cavity portion along the signal pattern line in a plan view of the multilayer substrate.

3. The transmission line according to claim 1, further comprising:
a first ground via hole conductor arranged in a portion of the intermediate ground pattern conductor overlapped with the signal pattern line in a plan view of the multilayer substrate, wherein the intermediate ground pattern conductor is connected to the ground pattern conductor with the first ground via hole conductor.

4. The transmission line according to claim 2, further comprising:
a first ground via hole conductor arranged in a portion of the intermediate ground pattern conductor overlapped with the signal pattern line in a plan view of the multilayer substrate, wherein the intermediate ground pattern conductor is connected to the ground pattern conductor with the first ground via hole conductor,
wherein the first ground via hole conductor is arranged in the first projecting portion.

5. The transmission line according to claim 2,
wherein the signal pattern line includes
a wide width portion including the first end portion, and
a narrow width portion connected to the wide width portion and narrower than the wide width portion, and
wherein the first projecting portion is overlapped with the narrow width portion and is not overlapped with the wide width portion in a plan view of the multilayer substrate.

6. The transmission line according to claim 1, further comprising:
a signal via hole line connected to the signal pattern line and extending in the laminating direction of the multilayer substrate to pass through the intermediate ground pattern conductor at a position different from a position of the first cavity portion.

7. The transmission line according to claim 6, further comprising:
a second cavity portion provided in the intermediate ground pattern conductor, wherein the signal via hole line passes through the second cavity portion, and
wherein, in a plan view of the multilayer substrate, a second end edge being an end edge of the second cavity portion has a second overlapping portion overlapped with the signal pattern line, the signal pattern line has a second connection point to which the signal via hole line is connected, and a distance between the second overlapping portion and the second connection point is shorter than a distance between any portion other than the second overlapping portion of the second end edge and the second connection point.

8. The transmission line according to claim 7,
wherein the intermediate ground pattern conductor has a second projecting portion projecting toward an inside of the second cavity portion along the signal pattern line.

9. The transmission line according to claim 7, further comprising:
a second ground via hole conductor arranged at a position of the intermediate ground pattern conductor overlapped with the signal pattern line in a plan view of the multilayer substrate, wherein the intermediate ground pattern conductor is connected to the ground pattern conductor with the second ground via hole conductor.

10. The transmission line according to claim 8, further comprising:
a second ground via hole conductor arranged at a position of the intermediate ground pattern conductor overlapped with the signal pattern line in a plan view of the multilayer substrate, wherein the intermediate ground pattern conductor is connected to the ground pattern conductor with the second ground via hole conductor,
wherein the second ground via hole conductor is arranged in the second projecting portion.

11. The transmission line according to claim 1, further comprising:
a signal-layer ground pattern conductor arranged at a same position as a position of the signal pattern line in the laminating direction of the multilayer substrate, wherein the signal pattern line includes a strip line portion and a coplanar line portion, the strip line portion includes the first end portion, and the coplanar line portion is arranged in a slit portion provided in the signal-layer ground pattern conductor.

12. The transmission line according to claim 6,
wherein the signal pattern line includes a plurality of signal pattern lines; and
wherein the signal via hole line includes a plurality of signal via hole lines each connected to the respective plurality of signal pattern lines.

13. An antenna module comprising:
the transmission line according to claim 12; and
a plurality of patch antennas connected to the respective plurality of signal via hole lines of the transmission line and arranged in an array pattern.

14. The antenna module according to claim 13, further comprising:
an integrated circuit including a plurality of terminals connected to the respective plurality of signal pattern lines of the transmission line.

15. The antenna module according to claim 14,
wherein the multilayer substrate has a first main surface and a second main surface positioned at a rear side of the first main surface,
wherein the integrated circuit is arranged on the first main surface, and
wherein the plurality of patch antennas is arranged at a side of the second main surface with respect to the first main surface.

16. The transmission line according to claim 2, further comprising:
a first ground via hole conductor arranged in a portion of the intermediate ground pattern conductor overlapped with the signal pattern line in a plan view of the multilayer substrate, wherein the intermediate ground pattern conductor is connected to the ground pattern conductor with the first ground via hole conductor.

17. The transmission line according to claim 3,
wherein the signal pattern line includes
a wide width portion including the first end portion, and
a narrow width portion connected to the wide width portion and narrower than the wide width portion, and
wherein the first projecting portion is overlapped with the narrow width portion and is not overlapped with the wide width portion in a plan view of the multilayer substrate.

18. The transmission line according to claim 4,
wherein the signal pattern line includes
a wide width portion including the first end portion, and
a narrow width portion connected to the wide width portion and narrower than the wide width portion, and
wherein the first projecting portion is overlapped with the narrow width portion and is not overlapped with the wide width portion in a plan view of the multilayer substrate.

19. The transmission line according to claim 2, further comprising:
a signal via hole line connected to the signal pattern line and extending in the laminating direction of the multilayer substrate to pass through the intermediate ground pattern conductor at a position different from a position of the first cavity portion.

20. An antenna module comprising:
a transmission line and at least one of a patch antenna and an integrated circuit connected to the transmission line,
wherein the transmission line includes
a multilayer substrate comprised of a dielectric body,
a signal pattern line arranged in the multilayer substrate,
a ground pattern conductor arranged at a position different from a position of the signal pattern line in a laminating direction of the multilayer substrate and overlapped with the signal pattern line in a plan view of the multilayer substrate,
an intermediate ground pattern conductor arranged between the signal pattern line and the ground pattern conductor in the laminating direction of the multilayer substrate and electrically connected to the ground pattern conductor, and
a signal via hole line connected to one end portion of the signal pattern line and extending from the signal pattern line in a direction away from the intermediate ground pattern conductor in the laminating direction of the multilayer substrate,
wherein a cavity portion opening at a position overlapped with the one end portion in a plan view of the multilayer substrate is provided in the intermediate ground pattern conductor, and
wherein the signal via hole line is connected to the patch antenna or the integrated circuit via no line extending in the laminating direction.

* * * * *